(12) United States Patent
Morgan et al.

(10) Patent No.: US 10,199,527 B2
(45) Date of Patent: Feb. 5, 2019

(54) SOLAR CONCENTRATOR AND ILLUMINATION APPARATUS

(71) Applicant: MORGAN SOLAR INC., Toronto (CA)

(72) Inventors: John Paul Morgan, Toronto (CA); Brett Barnes, Toronto (CA); Stefan Myrskog, Maple (CA); Stephen Caelers, Toronto (CA); Samuel Kim, Toronto (CA); Trevor Vaughan, Toronto (CA); Brandon Lehoux, Toronto (CA)

(73) Assignee: MORGAN SOLAR INC., Toronto (CA)

( * ) Notice: Subject to any disclaimer, the term of this patent is extended or adjusted under 35 U.S.C. 154(b) by 0 days.

(21) Appl. No.: 15/588,816

(22) Filed: May 8, 2017

(65) Prior Publication Data

US 2018/0323331 A1  Nov. 8, 2018

(51) Int. Cl.
| | |
|---|---|
| *H01L 31/042* | (2014.01) |
| *H01L 31/173* | (2006.01) |
| *H02S 40/22* | (2014.01) |
| *H01L 31/048* | (2014.01) |
| *H02S 20/32* | (2014.01) |

(52) U.S. Cl.
CPC ......... *H01L 31/173* (2013.01); *H01L 31/048* (2013.01); *H02S 20/32* (2014.12); *H02S 40/22* (2014.12)

(58) Field of Classification Search
CPC ..... H01L 31/173; H01L 31/048; H02S 20/32; H02S 40/22

USPC ........................................................ 136/246
See application file for complete search history.

(56) References Cited

U.S. PATENT DOCUMENTS

| | | |
|---|---|---|
| 9,151,879 B2 | 10/2015 | Den Boer et al. |
| 2008/0027177 A1 | 1/2008 | Nishikawa et al. |
| 2014/0261625 A1 | 9/2014 | Morgan et al. |
| 2014/0261630 A1 | 9/2014 | Morgan |
| 2014/0261631 A1 | 9/2014 | Morgan et al. |
| 2014/0268758 A1 | 9/2014 | Morgan et al. |
| 2014/0283895 A1 | 9/2014 | Morgan et al. |
| 2014/0286017 A1 | 9/2014 | Morgan et al. |
| 2015/0083899 A1 | 3/2015 | Morgan et al. |
| 2015/0255654 A1 | 9/2015 | Morgan et al. |

*Primary Examiner* — Jayne L Mershon
(74) *Attorney, Agent, or Firm* — BCF LLP

(57) ABSTRACT

Device for harvesting direct sunlight, transmitting diffuse sunlight and for scattering light from a light source to provide illumination, including: a receiving layer including at least one solar energy collector and at least one light source; at least one optical component disposed on a first side of the receiving layer, the optical component including at least one plano-convex refracting element; a second optical component disposed on a second side of the receiving layer, the second optical component comprising at least one optical element; wherein the at least one plano-convex element is positioned to receive direct light and refract it towards the at least one optical element of the second optical component, and wherein the optical element is positioned to reflect light towards the solar energy collector; wherein the at least one optical element is positioned to refract and emit indirect light impinging thereon towards the exterior of the apparatus.

23 Claims, 22 Drawing Sheets

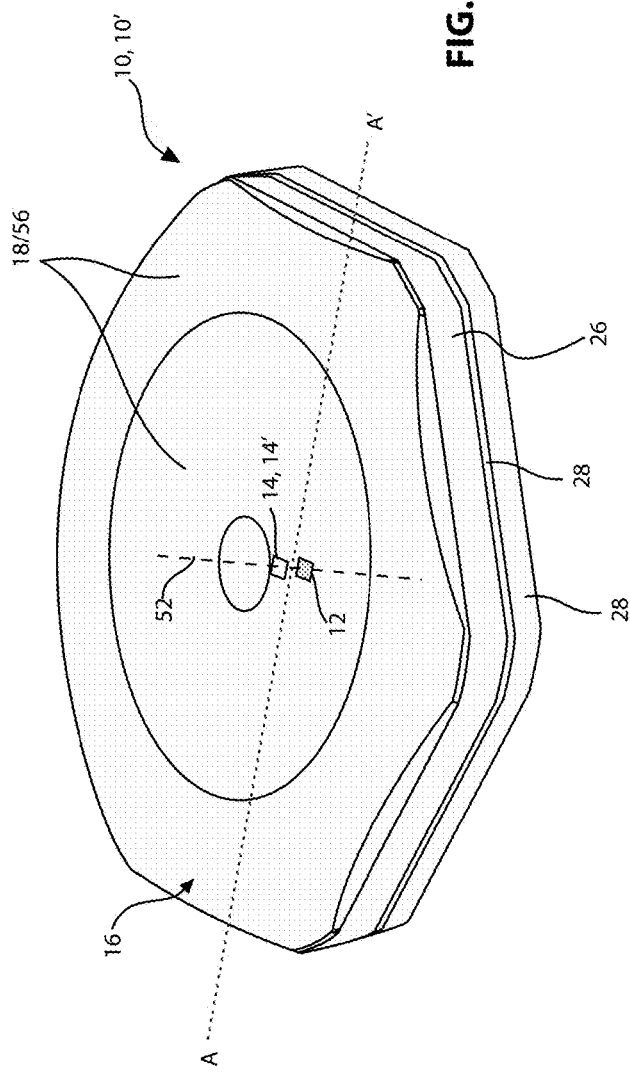
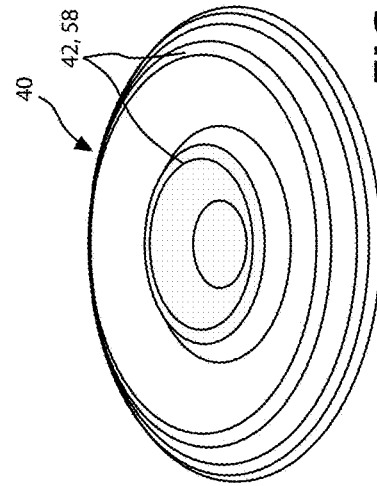

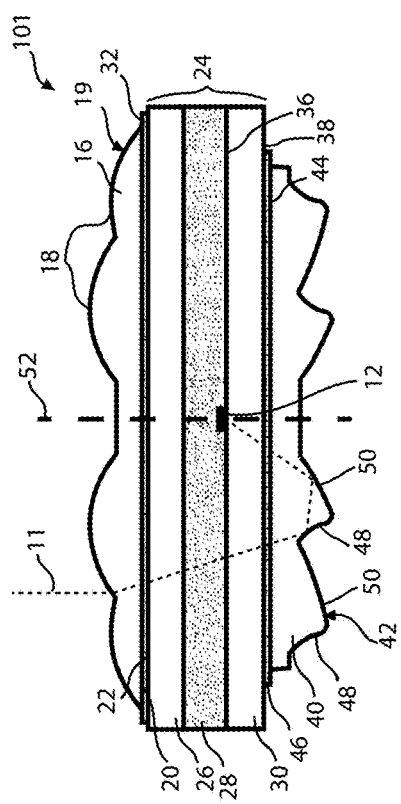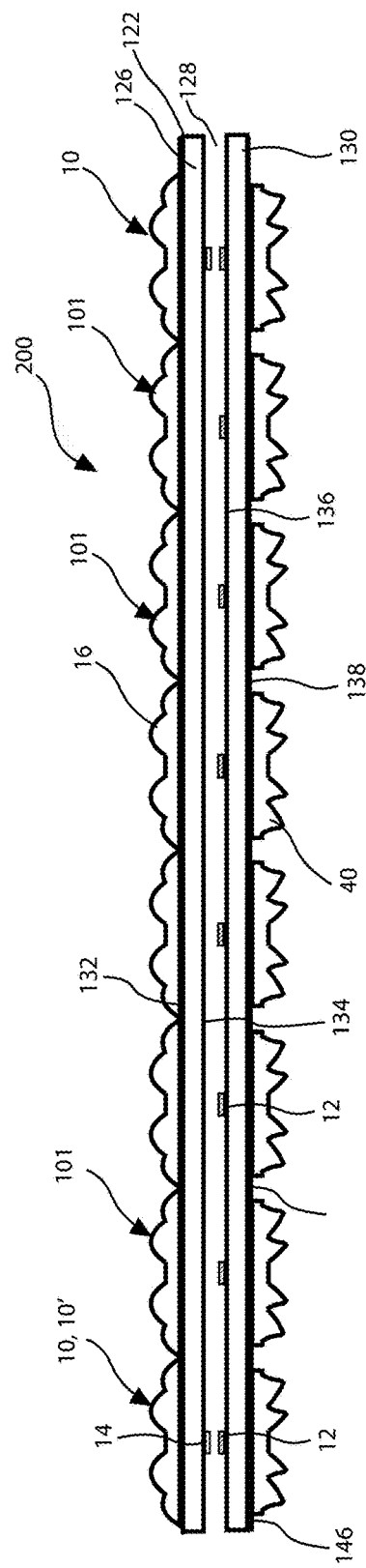

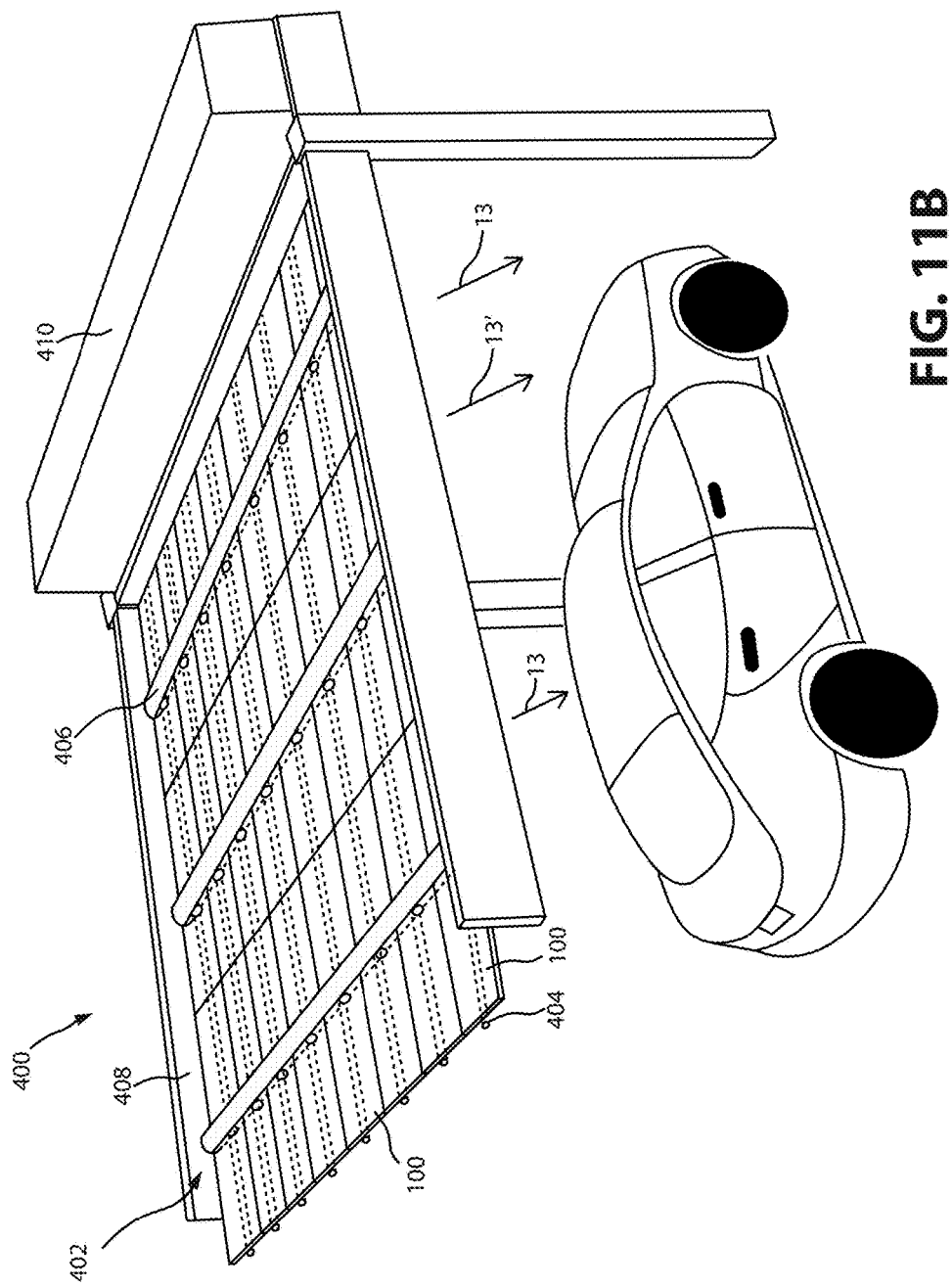

SOLAR CONCENTRATOR AND ILLUMINATION APPARATUS

TECHNICAL FIELD

The present technology relates generally to light panels and illumination devices, particularly to a concentrated photovoltaic and illumination panel.

BACKGROUND

In the field of solar energy, conventional photovoltaic panels are used to generate electricity from sunlight. Conventional photovoltaic panels consist of arrays of photovoltaic cells, with each cell consisting of a semiconductor (e.g. monocrystalline silicon or polycrystalline silicon) substrate. The photovoltaic cells collect the solar energy and convert the solar energy into an electric current, where the power output from such conventional photovoltaic panels is a direct function of the total substrate area of the array. As a result, sizeable arrays of large, expensive semiconductor substrates are typically needed to generate sufficient electrical output.

There has been research and product development for many alternative methods of harvesting the energy from the sun to produce electric energy. In the field of concentrated photovoltaics (CPV), the need for large semiconductor substrates can be substantially reduced by concentrating solar light with optical elements, such as lenses and reflectors. The optical elements collect light over a wide surface area and direct the light towards a photovoltaic cell of substantially smaller surface area. The optical elements can be made of inexpensive materials such as glass or polymers to achieve competitive prices, and the photovoltaic cell is typically a high efficiency multi-junction cell for improving efficiency.

U.S. Patent Application Publication No. 2008/0271776 A1 to Morgan describes a solar energy system that uses a light-guide solar panel (LGSP) to trap light inside a transparent panel and propagate the light to one of the panel edges for harvesting by a solar energy collector such as a photovoltaic cell. This technology eliminates the depth requirements inherent in traditional concentrated photovoltaic solar energy systems.

It has long been considered desirable to integrate photovoltaic technology into commercial and residential buildings, however, to date, such systems have been generally limited to conventional PV systems, which absorb or block all incoming direct and diffuse light.

Since CPV systems can be made of transparent materials, capable of transmitting diffuse light to the inside of a building, it is desirable to develop a system which would could be used in construction and placed over windows, for example, to allow diffuse light to enter, while direct sunlight is concentrated by the panels. It is also desirable to integrate illumination capabilities into these panels, such that they can act as illumination systems when there is no sunlight. It is therefore an object at least to provide a novel concentrated photovoltaic and illumination panel.

U.S. Pat. No. 9,151,879 to Boer et al. describes a building-integrated photovoltaic system having a cylindrical lens array used in combination with strip solar cells and lateral displacement tracking systems, permitting diffuse light to pass through to the interior of the building, where the strip solar cells may absorb direct light and convert it to electricity. The system described by Boer uses optics lenses that focus light directly onto the strip solar cells, adding the requirement of a frame to hold the components apart from each other such that the solar strips are positioned at the depth of the focus of the lenses.

Improvements are generally desired, as well as useful integration of illumination technology with scattering optics. It is therefore an object at least to provide a novel concentration photovoltaic and illumination panel.

SUMMARY

It is an object of the present technology to ameliorate at least some of the inconveniences present in the prior art.

It is another object of the present technology to provide a solar concentration and illumination device for harvesting direct sunlight, for transmitting diffuse light to the exterior of the device, and for providing illumination by scattering light from a light source Embodiments of the present technology provide a solar concentration and illumination apparatus comprising: a receiving layer comprising at least one solar energy collector and at least one light source; at least one first transparent optical component disposed on a first side of the receiving layer, the at least one first transparent optical component comprising at least one plano-convex refracting element; at least one second transparent optical component disposed on a second side of the receiving layer, the at least one second transparent optical component comprising at least one optical element; wherein the at least one plano-convex element is positioned to receive direct light along an optical axis and refract it towards the at least one optical element of the at least one second transparent optical component, and wherein the at least one optical element is positioned to reflect light towards the at least one solar energy collector; and wherein the at least one optical element is positioned to refract and emit diffuse light impinging thereon towards the exterior of the solar concentrator and illumination apparatus.

In one aspect, the receiving layer can comprise a rigid transparent sheet with the at least one light source attached to a first side of the rigid transparent sheet, and the at least one solar energy collector attached to a second side of the rigid transparent sheet. In another aspect, the receiving layer can comprise a first transparent sheet and a second transparent sheet parallel to one another, where the at least one solar energy collector and the at least one light source can be disposed between the first transparent sheet and the second transparent sheet. The light source can be attached to the first transparent sheet, and the at least one solar energy collector can be attached to the second transparent sheet, or vice versa.

In one embodiment, the at least one plano-convex element is positioned to receive direct light along an optical axis and refract it towards the at least one optical element of the at least one second transparent optical component, and the at least one optical element is positioned to reflect light towards the at least one solar energy collector; and the at least one optical element of the second transparent component is positioned to receive light from the at least one light source, and to refract and emit light to the exterior of the solar concentration and illumination apparatus. In another aspect, the at least one plano-convex element is positioned to receive light from the at least one light source and to refract and emit light to the exterior of the solar concentration and illumination apparatus.

In another embodiment, the at least one optical element of the second transparent optical component comprises a first curved surface and a second curved surface. In a first mode of operation the first curved surface is positioned to receive light from the plano-convex element and reflect the light towards the second curved surface which in turn is positioned to receive light from the first curved surface and reflect the light towards the at least one solar energy collector. Furthermore, the first curved surface and the second curved surface are positioned to reflect light by total internal reflection. Furthermore, the first curved surface is positioned to reflect light to the second curved surface by a single reflection. In some embodiments, the second curved surface is positioned to reflect light to the solar energy collector by a single reflection.

Each of the at least one first transparent optical components and each of the at least one second transparent optical components include at least one planar surface. In embodiments where the receiving layer is formed by two transparent sheets, the first transparent sheet comprises a first planar surface and a second planar surface, and the second transparent sheet comprises a third planar surface and a fourth planar surface and the light source is attached to the second planar surface or to the third planar surface, and the solar energy collector is attached to the second planar surface or to the third planar surface; and the first transparent optical component is attached to the first planar surface, and the second transparent optical component is attached to the fourth planar surface. In one aspect, the solar energy collector is attached to the second planar surface, and the light source is attached to the third planar surface. In another aspect, the solar energy collector is attached to the third planar surface, and the light source is attached to the second planar surface.

The solar concentration and illumination apparatus can be a solar concentration and illumination panel comprising an array of first transparent optical components; an array of second transparent optical components; an array of light sources; and array of solar energy collectors. In one aspect, each first transparent optical component is aligned with one of the second transparent optical components and with one of the solar energy collectors along an optical axis. In another embodiment, each of the light sources is aligned with one of the first transparent optical components, one of the second transparent optical components, and one of the solar energy collectors along an optical axis.

In embodiments where the receiving layer comprises a single rigid transparent sheet, an array of light sources can be attached to a first side of the rigid transparent sheet, and an array of solar energy collectors can be attached to a second side of the rigid transparent sheet. In another aspect, an array of solar energy collectors can be attached to the first side of the rigid transparent sheet, and an array of light sources can be attached to the second side of the rigid transparent sheet.

In embodiments where the receiving layer comprises a first transparent sheet and a second transparent sheet parallel to one another, the array of solar energy collectors and the at array of light sources are disposed between the first transparent sheet and the second transparent sheet. The array of light sources can be attached to the first transparent sheet, and the array of solar energy collectors is attached to the second transparent sheet. In another aspect, the array of solar energy collectors can be attached to the first transparent sheet, and the array of light sources can be attached to the second transparent sheet.

In one aspect, the at least one plano-convex element is positioned to receive direct light along an optical axis and refract it towards the at least one optical element of the at least one second transparent optical component, and wherein the at least one optical element is positioned to reflect light towards the at least one solar energy collector; and wherein the at least one plano-convex element of the first transparent component is positioned to receive light from the at least one light source, and to refract and emit light to the exterior of the solar concentration and illumination apparatus.

The at least one solar energy collector can be a photovoltaic cell.

The solar concentration and illumination apparatus further comprises an elastomeric layer between the at least one first optical component and the receiving layer, and an elastomeric layer between the at least one second optical component and the receiving layer. The solar concentration and illumination devices of the present technology can be mounted on a dual-axis tracking system.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

Embodiments will now be described more fully with reference to the accompanying drawings in which:

FIG. 3 is a top isometric view of a solar concentration and illumination device;

FIG. 4 is a top isometric view of a first optical component;

FIG. 5 is a top isometric view of a second optical component;

FIG. 7 is a cross-sectional view of a solar concentration and illumination device;

FIG. 8 is a cross-sectional view of a solar concentration and illumination panel;

FIG. 11B is a top isometric view of a solar concentration and illumination rooftop system;

DETAILED DESCRIPTION

For a better understanding of various features of the present technology, reference is made to the following description which is accompanied by FIGS. 1A to 12.

Figure 1A:
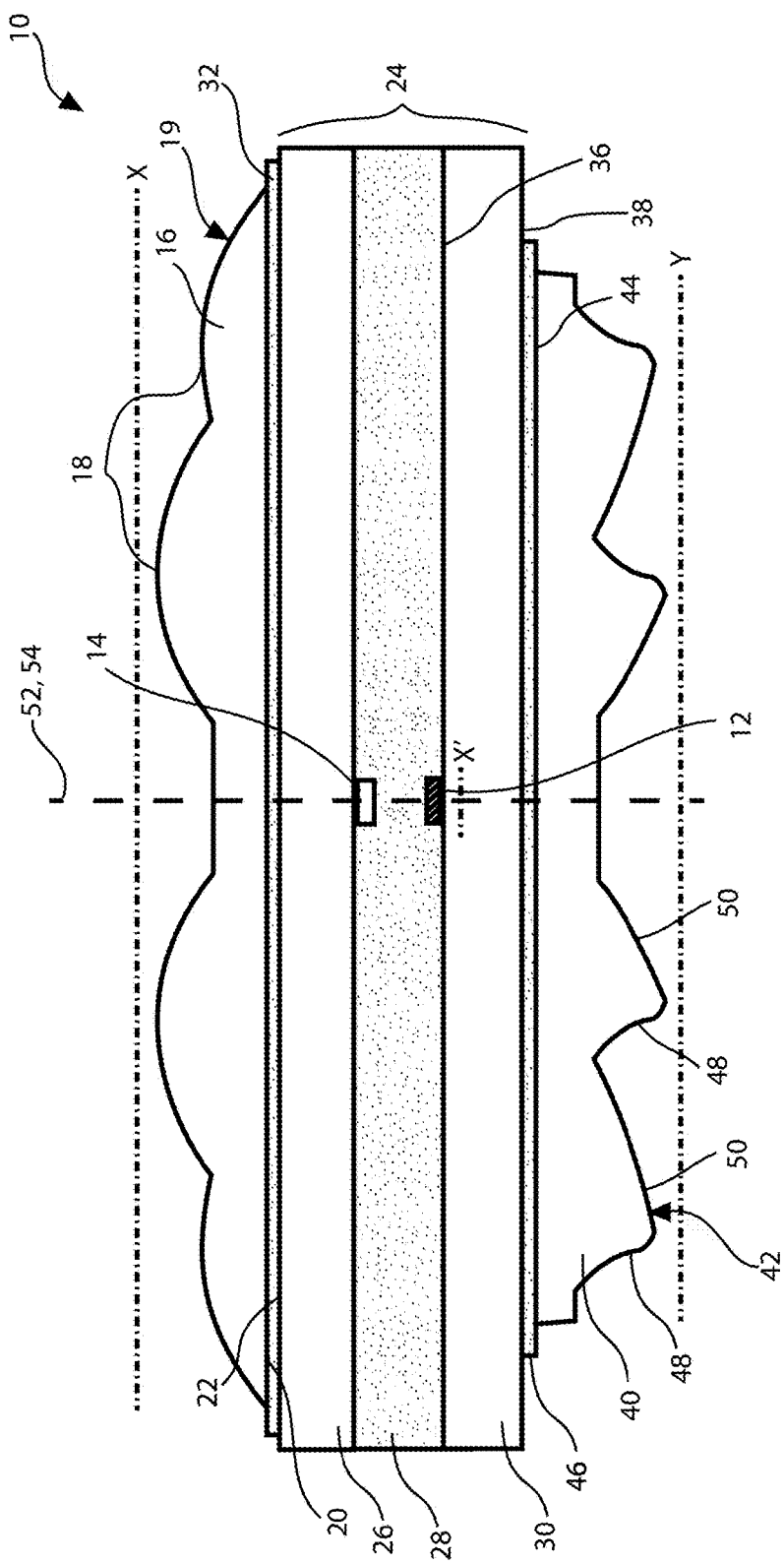
FIG. 1A is a cross-sectional view of a solar concentration and illumination device.
Figure 1B:
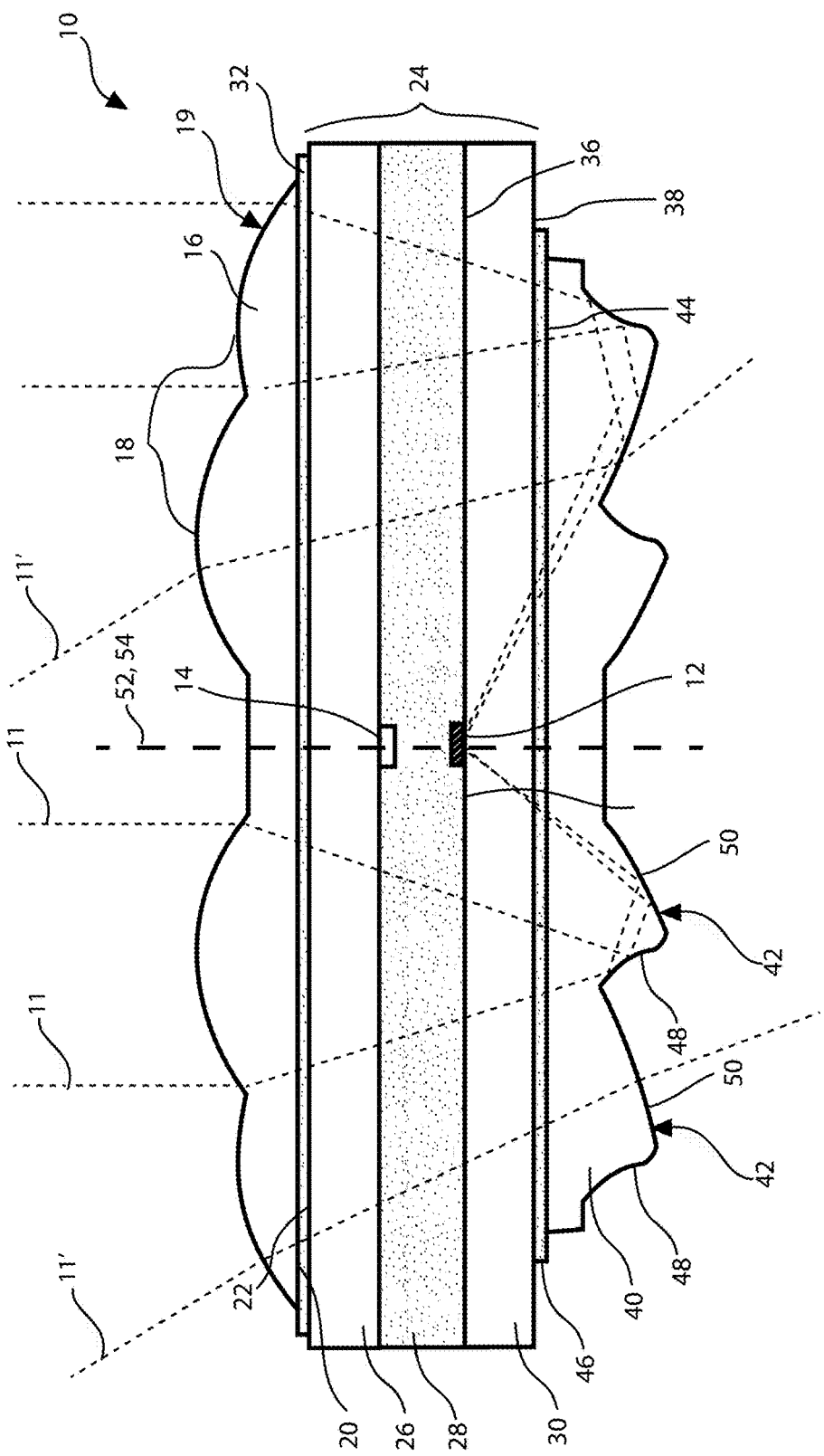
FIG. 1B is a cross-sectional view of a solar concentration and illumination device.
Figure 1C:
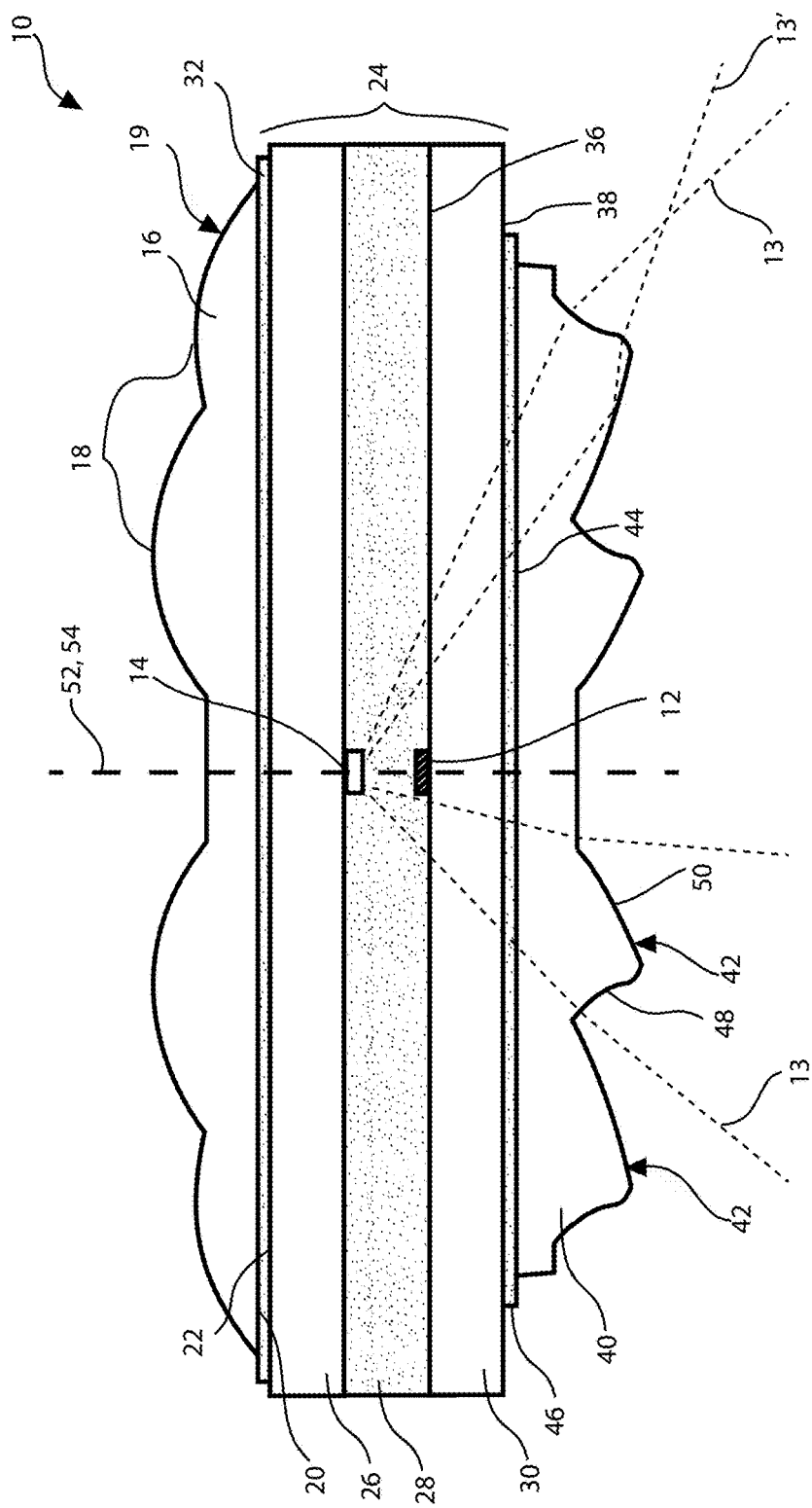
FIG. 1C is a cross-sectional view of a solar concentration and illumination device.

FIG. 1A-1C show a cross sectional view of an embodiment of a solar concentration and illumination device 10, for concentrating light over a surface area (X in cross section), to a solar energy collector 12 of substantially smaller surface area (X' in cross section) in a first mode of operation, and for scattering light from a point source (X' in cross section) over a substantially larger surface (Y in cross section) in a second mode of operation. Specifically, FIGS. 1A-1C show cross section A-A' of FIG. 3.

The solar concentration and illumination device 10 is made primarily of optically transparent components designed and positioned to transmit, refract and reflect direct light incoming parallel to an optical axis 52 to the solar energy collector 12, which may be a photovoltaic device, such as a high efficiency photovoltaic cell, such as a multi-junction solar cell. For example, the solar energy collector 12 can be a GaInP/GaInAs/Ge III-V triple-junction solar cell for generating electric energy from light. Furthermore, the solar concentration and illumination device 10 can use the same optically transparent components to scatter light 11 from the light source 14, which can be, for example, a light emitting diode (LED).

The solar concentration and illumination device 10 comprises a substantially planar first optical component 16, having two plano-convex refracting elements 18 or lenses for focusing direct light incoming parallel to optical axis 52 in a first mode of operation (as a solar concentration device). The first optical component 16 comprises a first flat surface 20. Each of the plano-convex elements 18 are formed by a convex surface 19 and a portion of a first flat surface 20.

Via the flat surface 20, the first optical component 16 can be optically and mechanically bonded to another flat surface (namely, to a first bonding surface 22 of the first transparent sheet 26, described in further detail below). Furthermore, the first optical component 16 is made of a solid optically transparent material, which in some embodiments may be an injection molded polymer such as PMMA (Poly(methyl methacrylate)). A person skilled in the art would understand that many alternative configurations of the first optical component 16 would fall under the scope of the present technology. In some exemplary embodiments, the first optical component 16 may have any desirable number of plano-convex elements 18. In some other exemplary embodiments, the plano-convex elements 18 may vary in shape, such that they may have any desired focal length to suit the design and functional needs of the solar concentration and illumination apparatus 10.

The solar concentration and illumination apparatus 10 further comprises a receiving layer 24 comprising a first transparent sheet 26, an encapsulating layer 28, a second transparent sheet 30, electrical conductors (not shown), the solar energy collector 12 and the light source 14. The electrical conductors, the solar energy collector 12, at least one light source 14, and the encapsulating layer 28 are sandwiched between the first transparent sheet 26 and the second transparent sheet 30. The first transparent sheet 26 and the second transparent sheet 30 are planar, optically transparent sheets of rigid material such as glass or a polymer.

In the embodiment of FIGS. 1A-1C, the first transparent sheet 26 and the second transparent sheet 30 provide rigidity to the solar concentration and illumination apparatus 10. The first transparent sheet 26 supports a portion of the electrical conductors and the light source 14, and aids in dissipating heat away from light source 14. The second transparent sheet 30 supports another portion of the electrical conductors and the solar energy collector 12, and aids in dissipating heat away from the solar energy collector 12. The thickness and material of the first transparent sheet 26 and the second transparent sheet 30 must therefore be chosen taking into account the amount of heat that the light source 14 and the solar energy collector 12 can produce, respectively, such that they can withstand the heat and cool the device 10 by conduction, without damaging any of the components.

At least a portion of the electrical conductors and the light source 14 are bonded mechanically to a second bonding surface 34 of the first transparent sheet 26, such that the electrical conductors conduct electricity to the light source 14. The electrical conductors are positioned to substantially avoid the optical path of light 11, 11', 13 being transmitted within the solar concentration and illumination device 10.

The first transparent sheet 26 is adjacent to the first optical component 16 and is optically and mechanically connected thereto from the first bonding surface 22 of the first transparent sheet 26.

An elastomeric first bonding layer 32 is positioned between the flat surface 20 of the first optical component 16 and the first bonding surface 22 of the first transparent sheet 26. The first bonding layer 32 may be composed of any suitable optical adhesive material, but preferably it is a light-transmissive elastomeric polymer with adhesive properties such as silicone, which can be applied to either the flat surface 20 or to the first bonding surface 22. The two surfaces (20, 22) may then be brought together to form an optical and mechanical bond between the first optical component 16 and the receiving layer 24. In some embodiments, a suitable material that can make up the first bonding layer 32 can be applied evenly, in liquid form, to the first bonding surface 22 or to the flat surface 20. This material may then cure or dry to form the first bonding layer 32, such that it creates a solid mechanical bond with each one of the components, holding them together firmly, yet compliantly where the material is elastomeric.

An elastomeric first bonding layer 32 is beneficial when the materials of the first optical component 16 and the first transparent sheet 26 have different coefficients of thermal expansion, since it allows the different components to expand or contract at different rates without breaking or impairing the bond between them. In an exemplary embodiment, where the first transparent sheet 26 is made of a material with a lower coefficient of thermal expansion than the first optical component 16, and the first bonding layer 32 is made of an elastomeric adhesive such as silicone, if the solar concentration and illumination device 10 is exposed to heat, the first optical component 16 will expand at a faster rate than the first transparent sheet 26, and the first bonding layer 32 will comply to the difference in thermal expansion, by stretching or expanding in response to the expansion of the first optical component 16 and the first transparent sheet 26, maintaining the optical and mechanical bond between the two components.

The second transparent sheet 30 comprises a third bonding surface 36 and a fourth bonding surface 38, both bonding surfaces (36, 38) being flat and parallel to one another. The first transparent sheet 26 and the second transparent sheet 30 can be sheets of glass or any suitable rigid, light-transmissive material that can provide rigidity to the solar concentration and illumination device 10, provide protection to the solar energy collectors 12, the light sources 14 and the electrical conductors (not shown), and allow heat to dissipate without damaging the solar concentration and illumination device 10. The encapsulating layer 28 occupies the space between the second bonding surface 34 of the first transparent sheet 26 and the third bonding surface 36 of the second transparent sheet 30. The encapsulating layer 28 protects the solar energy collector 12, the light source 14 and the electrical conductors, while creating an optical and mechanical bond between the first transparent sheet 26 and the second transparent sheet 30. If the refractive indices of the encapsulating layer 28, the first transparent sheet 26, and the second transparent sheet 30 are sufficiently matched, the overall efficiency of the solar energy collection and illumination device 10 may be increased, since index matching significantly reduces backscattering, and allows light 11, 11', 13 to travel within the receiving layer 24 with negligible angles of refraction. The encapsulating layer 28 can be any suitable optically transparent material including a gas such as air, an optical immersion liquid, an optical gel, or any index matched, light transmissive material or polymer such as silicone, preferably. In practical embodiments such as that of FIG. 1A-1C, the material of the encapsulating layer 28 has optical and adhesive properties.

The solar concentration and illumination device 10 further comprises a substantially planar second optical component 40, adjacent to the receiving layer 24, and optically and mechanically connected thereto. The second optical component 40 comprises two optical elements 42. The second optical component 40 also comprises a second flat surface 44, so that it can be optically and mechanically bonded to the fourth bonding surface 38 of the second transparent sheet 30. Furthermore, the second optical component 40 is made of an optically transparent material, which may be an injection molded polymer such as PMMA, or any other suitable transparent material, such as polymers or glass.

An elastomeric second bonding layer 46 is positioned between the flat surface 44 of the second optical component 40 and the fourth bonding surface 38 of the second transparent sheet 30. The second bonding layer 46 may be composed of any suitable optical adhesive, but preferably it is a light-transmissive elastomeric polymer with adhesive properties such as silicone, which can be applied to either the flat surface 44 or to the fourth bonding surface 38. The two surfaces (44, 38) may then be brought together to form an optical and mechanical bond between the second optical component 40 and the receiving layer 24. In some embodiments, a suitable material that can make up the second bonding layer 46 can be applied evenly, in liquid form, to the fourth bonding surface 38 or to the second flat surface 44. This material may then cure or dry to form the second bonding layer 46, such that it creates a solid mechanical bond with each one of the components, holding them together firmly, yet compliantly where the material is elastomeric.

An elastomeric second bonding layer 46 is beneficial when the materials of the second optical component 40 and the second transparent sheet 30 have different coefficients of thermal expansion, since it allows the different components to expand or contract at different rates without breaking or impairing the bond between them. In an exemplary embodiment, where the second transparent sheet 30 is made of a material with a lower coefficient of thermal expansion than the second optical component 40, and the second bonding layer 46 is made of an elastomeric adhesive such as silicone, if the solar concentration and illumination apparatus 10 is exposed to heat, the second optical component 40 will expand at a faster rate than the second transparent sheet 30, and the second bonding layer 46 will comply to the difference in thermal expansion, by stretching or expanding in response to the expansion of the second optical component 40 and the second transparent sheet 30, maintaining the optical and mechanical bond between the two components.

A person skilled in the art would understand that many alternative configurations of the second optical component 40 would fall under the scope of the present technology. In some exemplary embodiments the second optical component 40 may have any desirable number of optical elements 42 to match the number of plano-convex elements 18, since these work in conjunction when the solar concentration and illumination device 10 is used as a solar concentrator, there being a one-to one relationship between the plano-convex elements 18 of the first optical component 16 and the optical elements 42 of the second optical component 40. In some other exemplary embodiments the optical elements 42 may vary in shape, such that they may have any desired shape or curvature to suit the design and functional needs of the solar concentration and illumination device 10.

In the embodiment of FIG. 1A-1C, each optical element 42 of the second optical component 40 comprises a first curved surface 48 and a second curved surface 50. In a first mode of operation of the solar concentration and illumination device 10, wherein the solar concentration and illumination device 10 is positioned with the first optical component 16 facing the sun to receive light directly and concentrate said light onto the solar energy collector 12, each first curved surface 48 is associated directly with one of the plano-convex elements 18 of the first optical component 16 to receive light 11 focused therefrom. The second curved surface 50 is adjacent to the first curved surface 48. Each of the second curved surfaces 50 is associated directly with the first curved surface 48 of the same optical element 42 and positioned to receive light therefrom. Therefore, for each pair of first and second curved surfaces (48 and 50 respectively), there is an associated plano-convex element 16.

Light 11, 11', 13 can travel through the body of the solar concentration and illumination apparatus 10 in three different manners. FIG. 1B shows a first mode of operation of the solar concentration and illumination apparatus 10 where it is oriented with the first optical component 16 facing the sun such that the optical axis 52 is aligned with the sun to within one or two degrees. To achieve this orientation the solar apparatus 10 can be mounted on a dual-axis tracking system. When the first optical components 16 are positioned in this manner, the plano-convex elements 18 can receive direct input light 11 and focus the light 11 by refraction, such that the focused light 11 travels through the bodies of the first optical component 16, the receiving layer 24, and the second optical component 40 towards an associated first curved surface 48, which, in turn, reflects the light 11 towards the associated second curved surface 50 which is positioned to receive light from its associated first curved surface 48, and reflect the light 11 via total internal reflection towards the solar energy collector 12 for converting the light 11 into electrical electricity. The solar concentration and illumination apparatus 10 should generally be capable of concentrating light 11 in the manner described above as long as its direction of travel is within one or two degrees of the optical axis 52.

A person skilled in the art would assume that not all light impinging on the solar concentration and illumination device 10 can be normal to the plane X, and some diffuse light 11' would also impinge thereon. This indirect or diffuse light 11' would not be focused by the plano-convex elements 16 to the optical elements 42 in the same manner that the direct light 11 would, and some of this indirect light would not be reflected by the optical elements 42 via total internal reflection towards the solar energy collector 12 since the angles of incidence of indirect light 11' impinging on the optical elements 42 will often be smaller than the critical angle necessary for total internal reflection, and therefore much of this indirect light 11' will instead be refracted at the surface of the optical elements 42 and transmitted through the first curved surfaces 48 and the second curved surfaces 50 to the outside of the apparatus 10. This light 11' that passes though the solar concentration and illumination apparatus 10 can be used to illuminate, for example, the interior of a building.

FIG. 10 shows a second mode of operation of the solar concentration and illumination device 10 where it functions as an illumination device. In this mode of operation, the solar concentration and illumination device 10 can be oriented with the second optical component 40 facing any direction that requires illumination. The light source 14 is powered by the electrical conductors, and light 13 emitted by the light source 14 travels through the bodies of the receiving layer 24 and the second optical component 40, such that light 13 is emitted and refracted or scattered by the first curved surface 48 and the second curved surface 50 of the optical elements 40. In some instances, light 13 can be reflected by one of the curved surfaces 48, 50 of the optical elements 42, and after one or more reflections, the light 13' can then be emitted by another one of the curved surfaces 48, 50. This mode of operation can be useful for illuminating, for example, the interior of a building.

Figure 2:
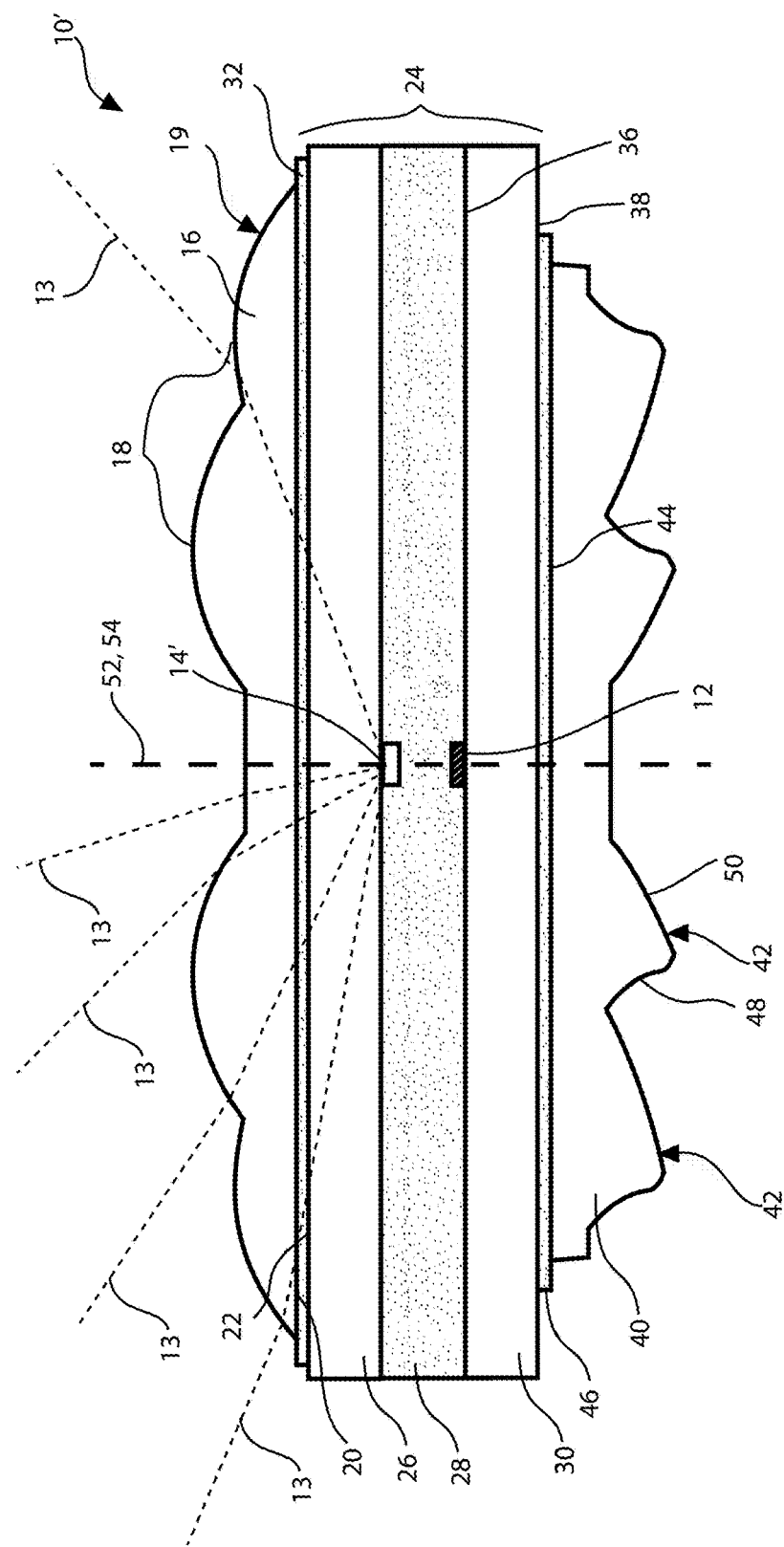
FIG. 2 is a cross-sectional view of a solar concentration and illumination device.

One alternative configuration of the solar concentration and illumination device 10' is shown in FIG. 2, where the light source 14' is positioned within the receiving layer 24 facing the first optical component 13, such that light 13 emitted from the light source 14' travels towards and is refracted by the plano-convex elements 18 and emitted to the outside of the solar illumination and concentration device 10'. This embodiment would allow light to be concentrated onto the solar energy collector exactly as described for FIGS. 1A-1C, but when used in the second mode of operation, as an illumination device, it would illuminate in the direction towards which the first optical component 16 is facing. This could be useful, for example, to illuminate the exterior of a building.

Although the cross sectional embodiment of FIGS. 1A-2 can be linearly extruded such that the plano-convex lenses 18 are linearly parallel and adjacent to one another, and such that the optical elements 42 are linearly parallel and adjacent to one another, extending from a central plane 54, higher efficiency can be achieved if each solar concentration and illumination device 10, 10' is formed by revolving the cross sectional embodiment of FIG. 1A-2 about an optical axis 52, running through the middle of the solar concentration and illumination device 10,10' as depicted in FIG. 3.

The embodiment of FIG. 3 comprises plano-convex elements 18 and the optical elements 42 which are revolved around an optical axis 52, and therefore, the plano-convex elements 18 are generally ring-shaped plano-convex lenses arranged in a concentric manner, and the optical elements 42 are generally ring-shaped optical elements 58 arranged in a concentric manner.

In embodiments where the solar concentration and illumination apparatus 10, 10' is generally symmetrical about optical axis 52 (revolved embodiments), the plano-convex elements 18 are concentric and adjacent plano-convex refracting rings 56 or lenses revolved around the optical axis 52 as shown in FIGS. 3 and 4. In such embodiments the optical elements 42 are concentric and adjacent optical rings 58, as shown in FIG. 5, for reflecting or refracting light depending on the angle of incidence. In embodiments where there are greater or fewer than two plano-convex refracting rings 56, there should be the same number of optical rings 58 in order for the solar concentration and illumination device 10, 10' to work effectively. Revolved embodiments can achieve much higher rates of concentration than linearly extruded embodiments.

A single solar concentration and illumination device 10, 10' as described above and shown in FIGS. 1A-3 is useful for concentrating light onto a solar energy collector 12 (for conversion into electrical energy) and for scattering light from a light source 14 over a wider surface area to provide illumination. However, greater benefits can be achieved from tiling several solar concentration and illumination devices 10, 10' to form a solar concentration and illumination panel 100 as shown in FIGS. 6A-6B.

An exemplary solar concentration and illumination panel 100 can have a single receiving layer 124, comprising an array of solar concentration and illumination devices 10, 10', the receiving layer 124 providing structure to the array of solar concentration devices 10, 10'.

Figure 6A:
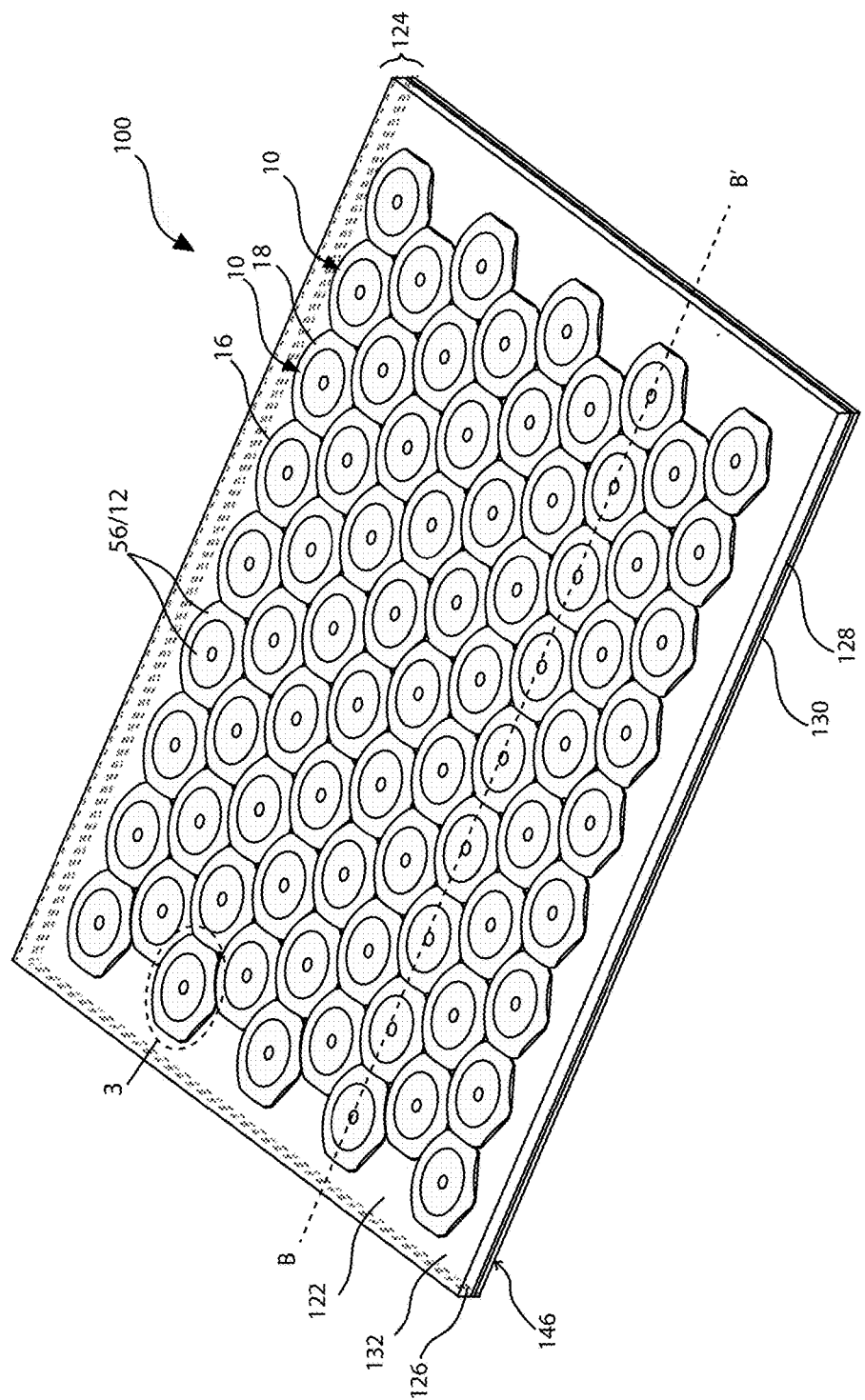
FIG. 6A is a top isometric view of a solar concentration and illumination panel.
Figure 6B:
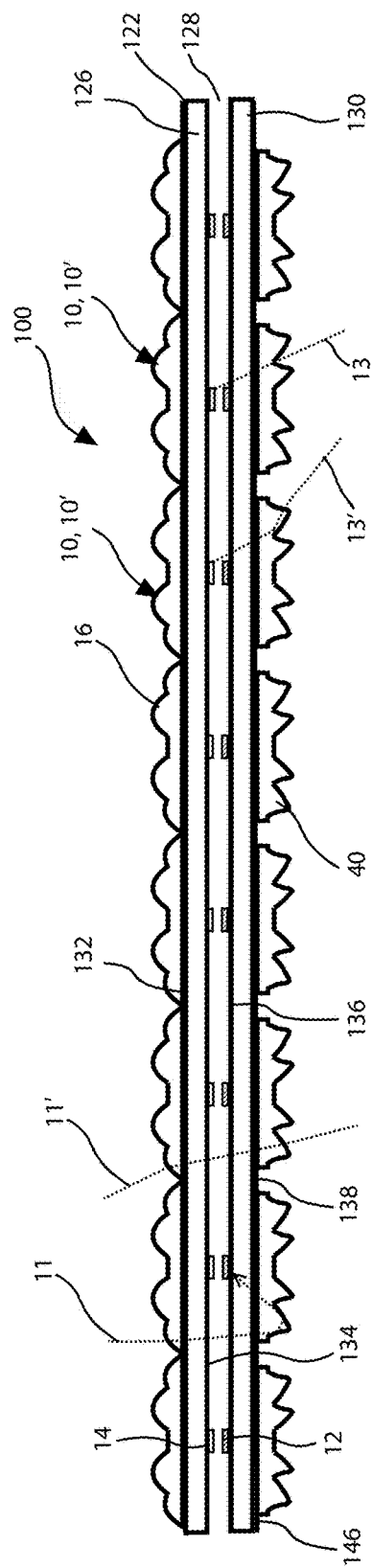
FIG. 6B is a cross-sectional view of a solar concentration and illumination panel.

FIG. 6A is a top perspective view of an embodiment of a hybrid solar concentration (CPV) and illumination panel 100. The panel 100 has a receiving layer 124, comprising an array of solar energy collectors 12 and light sources 14 wherein the single receiving layer 124 provides structure to an array of solar concentration and illumination devices 10, 10'. FIG. 6B shows cross section B-B' of FIG. 6A.

The receiving layer 124 comprises a first transparent sheet 126, an encapsulating layer 128, a second transparent sheet 130, an electrical circuit (not shown), and an array of solar energy collectors 12 and light sources 14 connected to the electrical circuit. The electrical circuit, the solar energy collectors 12, the light sources 14, and the encapsulating layer 128 are sandwiched between the first transparent sheet 126 and the second transparent sheet 130. The first transparent sheet 126 and the second transparent sheet 130 are planar, optically transparent sheets of rigid material such as glass or a polymer. A portion of the electrical circuit is bonded mechanically to the second bonding surface 134 of the first transparent sheet 126, such that electricity is conducted to the light sources 14; and the first transparent sheet 126, being in direct contact with the light sources 14 and the electrical conductors, aids in dissipating heat away from the light sources 14. Another portion of the electrical circuit is bonded mechanically to the third bonding surface 136 corresponding to the second transparent sheet 130, such that electricity and heat are conducted away from the solar energy collectors 12; and the second transparent sheet 130, being in direct contact with the solar energy collectors 12 and the electrical conductors, aids in dissipating heat away from the solar energy collectors. Furthermore, the electrical circuit is positioned to substantially avoid the optical path of light 11, 11', 13 being transmitted within the panel 100 through each of the solar concentration and illumination devices 10, 10' as descried in FIGS. 1A-2.

The encapsulating layer 128 occupies the space between the second bonding surface 134 of the first transparent sheet 126 and the third bonding surface 136 of the second transparent sheet 130. The encapsulating layer 128 protects the electrical conductors of the circuit, solar energy collectors 12 and the light sources 14 and creates an optical bond between the first transparent sheet 126 and the second transparent sheet 130, and if the refractive indices are sufficiently matched, it provides a higher overall efficiency to the panel 100, since index matching significantly reduces backscattering, and allows light 11, 11', 13 to travel within the receiving layer 124 with negligible angles of refraction. The encapsulating layer 128 can be any suitable optically transparent material including a gas such as air, an optical immersion liquid, an optical gel, or any index matched, light transmissive material or preferably a polymer such as silicone. In practical embodiments such as that depicted in FIGS. 6A and 6B, the material of the encapsulating layer 128 has optical and adhesive properties. For example, an index matched polymeric material such as silicone can be used to make up the encapsulating layer 128, wherein the index of refraction of the material forming the encapsulating layer 128 is matched to the index of refraction of the first transparent sheet 126 and the second transparent sheet 130, and such that the encapsulating layer 128 can hold the first transparent sheet 126 and the second transparent sheet 130 together in an optical and mechanical bond.

The plurality of first optical components 16 of each of the solar concentration and illumination devices 10 or 10' are optically and mechanically bonded to a first bonding surface 122 of the first transparent sheet 126 by means of a first bonding layer 132. Similar to the embodiments of FIGS. 1A-2, the first bonding layer 132 may be an elastomeric adhesive that is light-transmissive, and in the embodiment of FIGS. 6A and 6B, it can be applied to the first bonding surface 122 to create a bond with the plurality of first optical components 16, which are attached from their flat surface 20. It is possible to have the entire array of first optical components 16 formed as a single solid sheet of PMMA or any other suitable material, wherein the sheet comprising the plurality of first optical components 16 is bonded to the first bonding surface 122; or alternatively it is possible to form each of the first optical components 16 individually out of PMMA or any other suitable material and bond them separately to the first bonding surface 122 by means of the first bonding layer 132.

An elastomeric first bonding layer 132 is beneficial when the materials of the first optical components 16 and the first transparent sheet 126 have different coefficients of thermal expansion, since it allows the different components to expand or contract at different rates without breaking or impairing the bond between them. In an exemplary embodiment, where the first transparent sheet 126 is made of a material with a lower coefficient of thermal expansion than the first optical components 16, and the first bonding layer 132 is made of an elastomeric adhesive such as silicone, if the panel 100 is exposed to heat, the first optical components 16 will expand at a faster rate than the first transparent sheet 126, and the first bonding layer 132 will comply to the difference in thermal expansion, by stretching or expanding in response to the expansion of the first optical components 16 and the first transparent sheet 126, maintaining the optical and mechanical bond between the two components.

In the embodiment of FIGS. 6A and 6B, the first transparent sheet 126 and the second transparent sheet 130 provide rigidity to the panel 100. The thickness and material of the first transparent sheet 126 and the second transparent sheet 130 must be chosen taking into account the amount of heat that can be produced by the light sources 14 and the solar energy collectors 12, respectively, such that no heat damage occurs to the first optical components 16 and the second optical components 40.

The second transparent sheet 130 comprises a third bonding surface 136 and a fourth bonding surface 138, both bonding surfaces (136, 138) being flat and parallel to one another. The plurality of second optical components 40 of each of the solar concentration and illumination devices 10, 10' are optically and mechanically bonded to the fourth bonding surface 138 of the second transparent sheet 130 by means of a second bonding layer 146. Similar to the embodiment of FIGS. 1A-2, the second bonding layer 146 may be an elastomeric adhesive that is light-transmissive, and, in the embodiment of FIGS. 6A and 6B, it can be applied to the fourth bonding surface 138, to create a bond with the plurality of second optical components 40 of the array, which are attached from their flat surface 44. It is possible to form the entire array of second optical components 40 as a single solid sheet of PMMA or any other suitable material, wherein the sheet comprising the plurality of second optical components 40 is bonded to the fourth bonding surface 138; or alternatively it is possible to form each of the second optical components 40 individually out of PMMA or any other suitable material and bond them separately to the fourth surface 138 by means of the second bonding layer 146.

An elastomeric second bonding layer 146 is beneficial when the materials of the second optical components 40 and the second transparent sheet 130 have different coefficients of thermal expansion, since it allows the different components to expand or contract at different rates without breaking or impairing the bond between them. In an exemplary embodiment, where the second transparent sheet 130 is made of a material with a lower coefficient of thermal expansion than the second optical components 40, and the second bonding layer 146 is made of an elastomeric adhesive such as silicone, if the panel 100 is exposed to heat, the second optical components 40 will expand at a faster rate than the second transparent sheet 130, and the second bonding layer 146 will comply to the difference in thermal expansion, by stretching or expanding in response to the expansion of the second optical components 40 and the second transparent sheet 130, maintaining the optical and mechanical bond between the two components.

The embodiment of FIGS. 6A-6B shows a solar concentration and illumination panel 100 comprising an array of solar concentration and illumination devices 10 or 10', where the panel 100 can be composed entirely of solar concentration and illumination apparatuses 10 as described in FIGS. 1A-1C, or alternatively the panel 100 can be composed entirely of solar concentration and illumination apparatuses 10' as described in FIG. 2, or alternatively the panel 100 can be composed of a combination of solar concentration and illumination apparatuses 10 and 10' as described in FIGS. 1A-2.

FIG. 7 shows a cross section of solar concentration device 101 being nearly identical to the embodiments of solar concentration and illumination devices 10, 10' of FIGS. 1A-2, but lacking a light source on the second bonding surface 32 of the first transparent sheet 26. In the embodiment of FIG. 7, when the solar concentration device 101 is oriented with the first optical component 16 facing the sun, the plano-convex elements 16 can receive direct input light 11 and to focus the light 11 by refraction, such that the focused light 11 travels through the bodies of the first optical component 16, the receiving layer 24, and the second optical component 40 towards an associated first curved surface 48, which, in turn, reflects the light 11 towards the associated second curved surface 50 which is positioned to receive light from its associated first curved surface 48, and reflect the light 11 towards the solar energy collector 12 for converting the light 11 into electrical energy.

Figure 9:
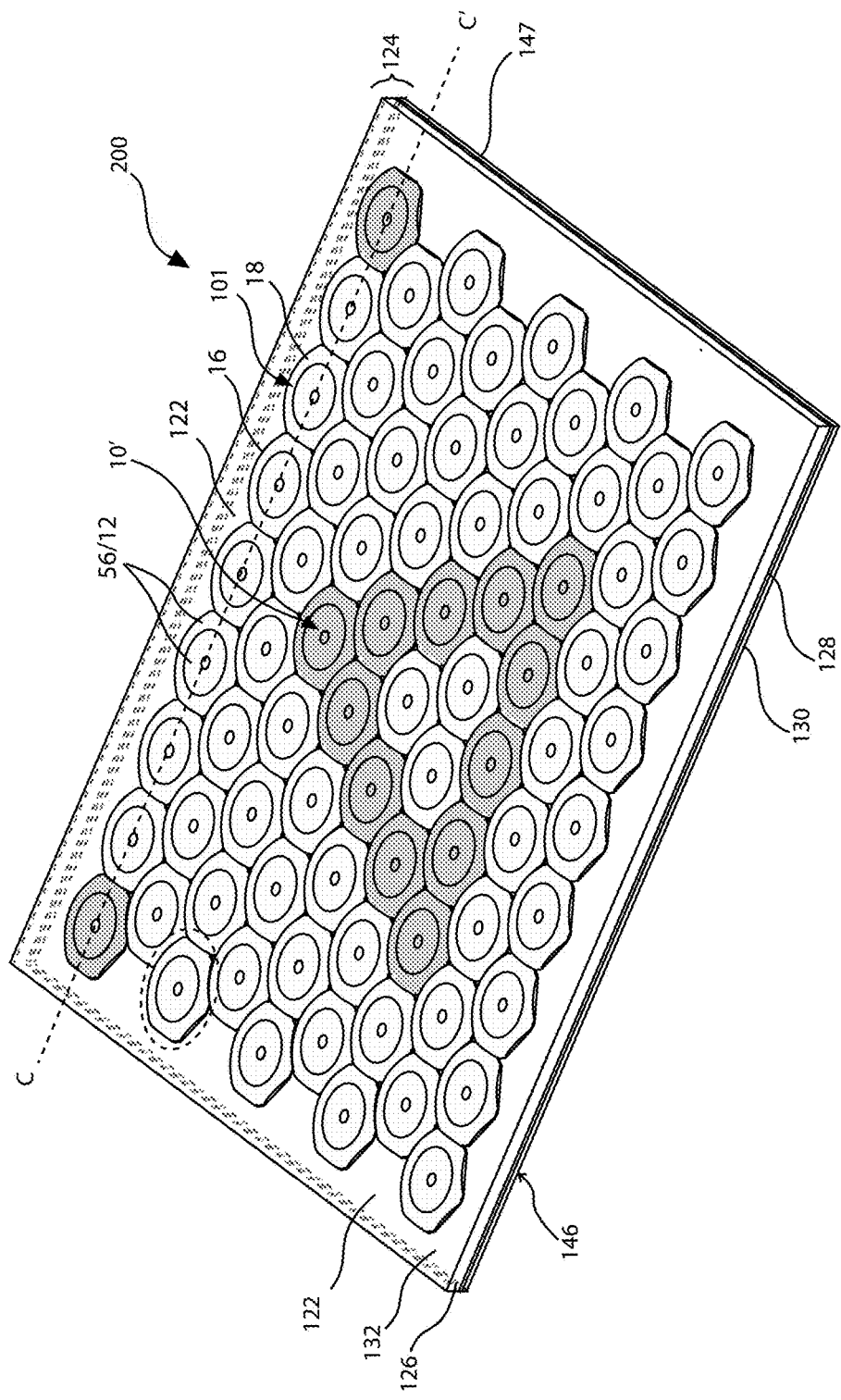
FIG. 9 is a top isometric view of a solar concentration and illumination panel.

It is possible to integrate a combination of solar concentration devices 101 and solar concentration and illumination devices 10, 10' into a solar concentration and illumination panel 200. One exemplary solar concentration and illumination panel 200 is shown in FIGS. 8 and 9, where FIG. 8 is a cross section C-C' of FIG. 9. In the embodiment of FIGS. 8 and 9, a patterned array of solar concentration devices 101 (as described in FIG. 7) and solar concentration and illumination devices 10' (as described in FIG. 2) form the solar concentration and illumination panel 200.

Light 11, 11' and 13 can travel through the body of the solar concentration and illumination panel 200 in three different manners. In a first mode of operation, the solar concentration and illumination panel 200 is oriented with the array of first optical components 16 facing the sun. To achieve this orientation the panel 200 can be mounted on a dual-axis tracking system. When the first optical components 16 are positioned in this manner, the plano-convex elements 18 can receive direct input light 11 and focus the light 11 by refraction, such that the focused light 11 travels through the bodies of the first optical components 16, the receiving layer 24, and the second optical components 40 towards the associated first curved surfaces 48, which, in turn, reflect the light 11 towards the associated second curved surfaces 50 which are positioned to receive light from their associated first curved surfaces 48, and reflect the light 11 towards the solar energy collectors 12 for converting the light 11 into electrical energy.

A person skilled in the art would assume that not all light impinging on the solar concentration and illumination panel 200 can be direct light 11, and some diffuse light 11' would also impinge thereon. This indirect or diffuse light 11' would not be focused by the plano-convex elements 16 to the optical elements 42 in the same manner that the direct light 11 would, and some of this indirect light would not be reflected by the optical elements 42 via total internal reflection towards the solar energy collectors 12 since the angles of incidence of indirect light 11' impinging on the optical elements 42 will often be smaller than the critical angle necessary for total internal reflection. Much of this indirect light 11' will instead be refracted at the surface of the optical elements 42 and transmitted through the first curved surfaces 48 and the second curved surfaces 50 to the outside of the panel 200. This light 11' that passes though the solar concentration and illumination panel 200 can be used to illuminate, for example, the interior of a building.

In a second mode of operation, the solar concentration and illumination panel 200 functions as an illumination device. In this mode of operation, the solar concentration and illumination panel 200 can be oriented with the first optical components 16 facing a direction that requires illumination. Since only the solar concentration and illumination apparatuses 10' comprise light sources 14, only these apparatuses 10' will provide illumination, and they can be arranged as desired, such that each solar concentration and illumination apparatus 10' can represent a pixel, and therefore the panel 200 can be used for signage.

The light sources 14 are powered by the electrical conductors, and light 13 emitted by the light source 14 travels through the bodies of the receiving layer 24 and the first optical component 16, such that light 13 is emitted and refracted or scattered by the plano-convex elements 18. For any desired application or design it is possible to modify the distribution of solar concentration and illumination apparatuses 10' accordingly within the panel 200.

Figure 10A:
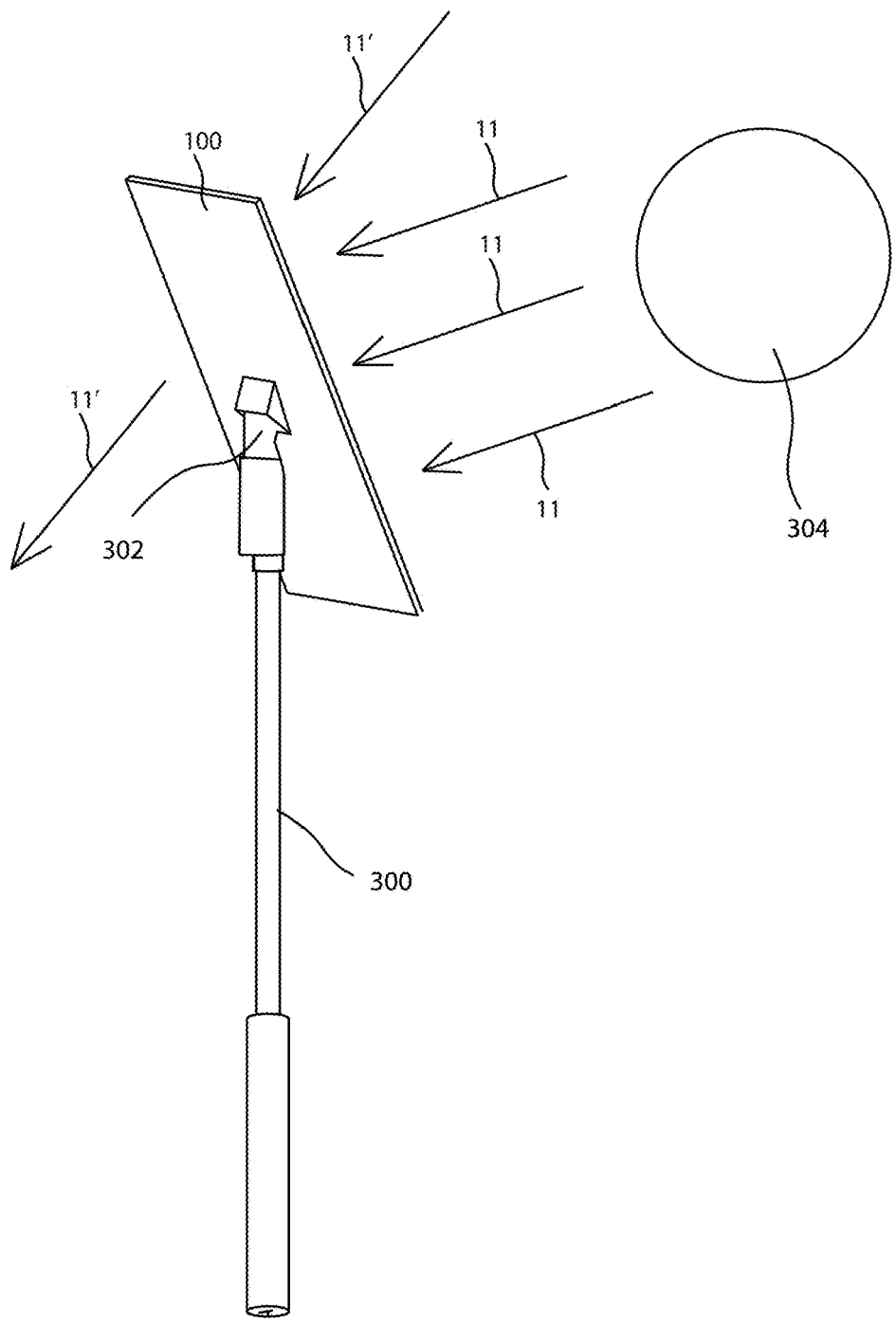
FIG. 10A is a side isometric view of a solar concentration and illumination lamp post system.
Figure 10B:
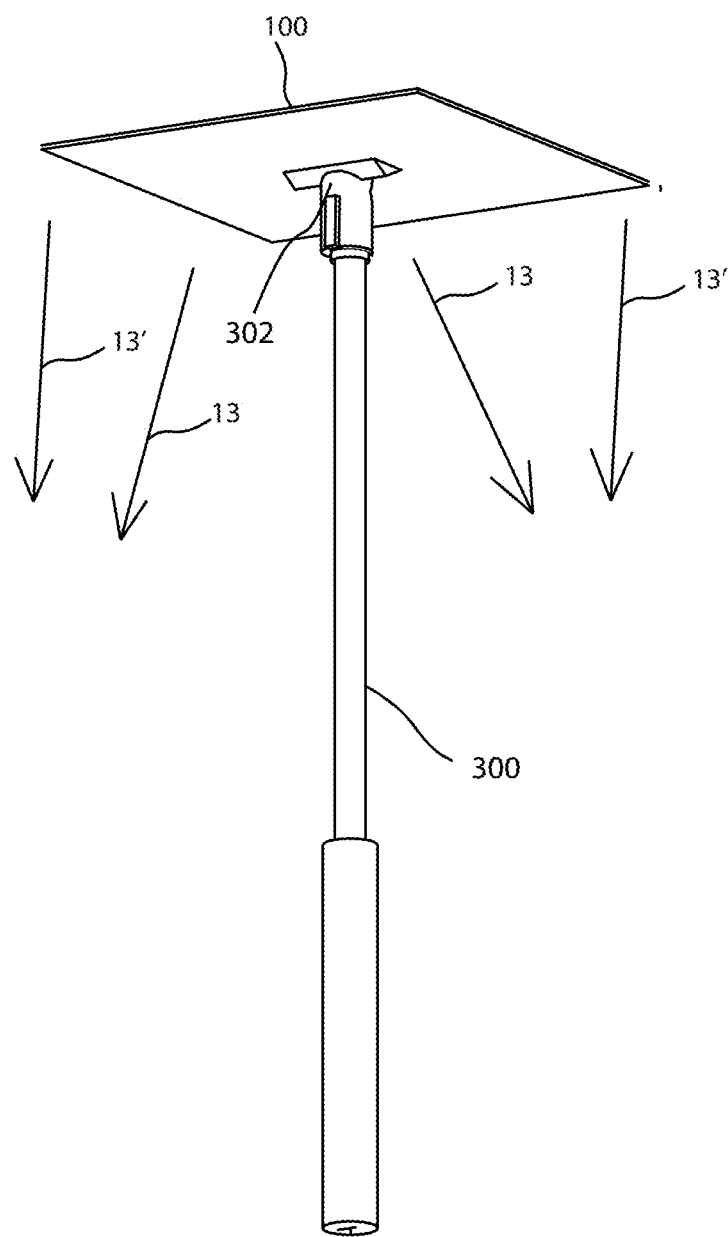
FIG. 10B is a front isometric view of a solar concentration and illumination lamp post system.

One useful application of the present technology is shown in FIGS. 10A and 10B, where a solar concentration and illumination panel 100 is mounted on a lamp post 300. The panel 100 has a receiving layer 124, comprising an array of solar energy collectors 12 and light sources 14 wherein the single receiving layer 124 provides structure to an array of solar concentration and illumination apparatuses 10.

The receiving layer 124 comprises a first transparent sheet 126, an encapsulating layer 128, a second transparent sheet 130, an electrical circuit (not shown), and an array of solar energy collectors 12 and light sources 14 connected to the electrical circuit. The electrical circuit, the solar energy collectors 12 and light sources 14, and the encapsulating layer 128 are sandwiched between the first transparent sheet 126 and the second transparent sheet 130. The encapsulating layer 128 can be any suitable optically transparent material including a polymer such as silicone. The material of the encapsulating layer 128 has optical and adhesive properties to hold the first transparent sheet 126 and the second transparent sheet 130 together in an optical and mechanical bond.

The plurality of first optical components 16 of each of the solar concentrators 10 are optically and mechanically bonded to a first bonding surface 122 of the first transparent sheet 126 by means of a first bonding layer 132. The plurality of second optical components 40 of each of the solar concentration and illumination apparatuses 10 are optically and mechanically bonded to the fourth bonding surface 138 of the second transparent sheet 130 by means of a second bonding layer 146.

The lamp post 300 comprises a dual-axis tracking system 302 which can rotate the panel 100 in altitude and azimuth, such that the first optical components 16 face the sun 304. When the first optical components are facing the sun 304, they can receive solar light 11 and focus it towards the second optical components 40, which by means of their optical elements 42 reflect the light 11 towards the solar energy collectors 12, which convert the light to electricity. As shown in FIG. 10A, indirect light 11' passes through the solar concentration and illumination panel 100, providing illumination below.

The dual-axis tracking system 302 can further rotate the panel 100 such that the second optical elements 40 are facing the ground, or any desired direction that requires illumination. In this mode of operation the light sources 14 emit light 13 towards the second optical elements 40 which by means of their optical elements 42 can reflect, refract and emit light 13, 13' to the outside of the panel, providing illumination.

Figure 11A:
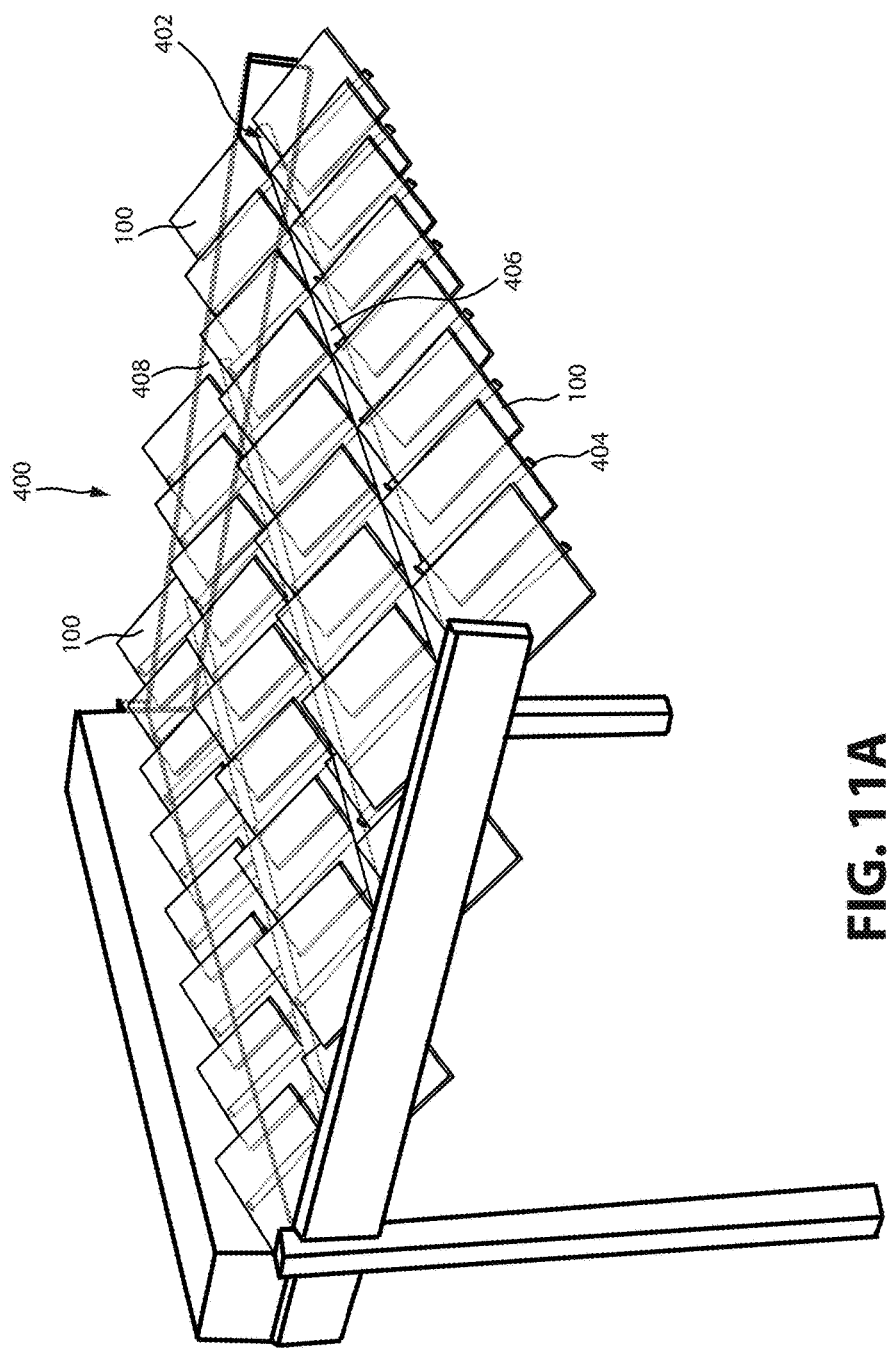
FIG. 11A is a top isometric view of a solar concentration and illumination rooftop system.

FIGS. 11A and 11B show a solar concentration and illumination system 400 comprising a plurality of solar concentration and illumination panels 100 (as described in FIGS. 1A-1B and 10A-10B) mounted on a dual-axis tilt and roll tracking system 402. The solar concentration and illumination system of FIGS. 11A-11B is comprised within a roofed parking lot, providing daylight illumination as well as artificial illumination.

The dual-axis tracking system 402 of FIGS. 11A and 11B comprises two rotation arms for rotating the panels 100 such that the first optical components 16 can face the sun and receive direct sunlight 11 for concentration. A plurality of first rotation arms 404 each support two solar concentration and illumination panels 100, and are activated by motors contained within a plurality of second rotation arms 406. Each second rotation arm 406 supports a string of eight first rotation arms 404 comprising two panels 100 each. The second rotation arms 404 are activated by motors contained within a frame 408. Electrical conductors for transmitting electricity to and from each panel 100 are also contained within the rotation arms 402, 404 and the frame 405

When the first optical components 16 are facing the sun, they can receive solar light 11 and focus it towards the second optical components 40, which by means of their optical elements 42 reflect the light 11 towards the solar energy collectors 12, which convert the light to electricity, while allowing indirect light 11' to pass through the solar concentration and illumination panel 100, providing illumination below.

The dual-axis tracking system 402 can further rotate the panels 100 such that the second optical elements 40 are facing the ground. In this mode of operation the light sources 14 emit light 13 towards the second optical elements 40 which by means of their optical elements 42 can reflect, refract and emit light 13, 13' to the outside of the panel, providing illumination as shown in FIG. 11B.

Embodiments similar to the one described in FIGS. 11A-11B can include any desired number of solar concentration and illumination panels 100, and distribution thereof for specific applications. A similar system can be placed on a building rooftop, over a skylight, such that the system 400 can track the sun and generate electricity from direct sunlight 11, while indirect light passes through the system and the skylight, providing natural light; and when needed, the illumination portion can be powered, providing power efficient illumination. It is also possible for the system to charge batteries contained within a power supply box 410, such that the system does not require extraction of electricity from the grid to power the light sources 14.

Figure 12:
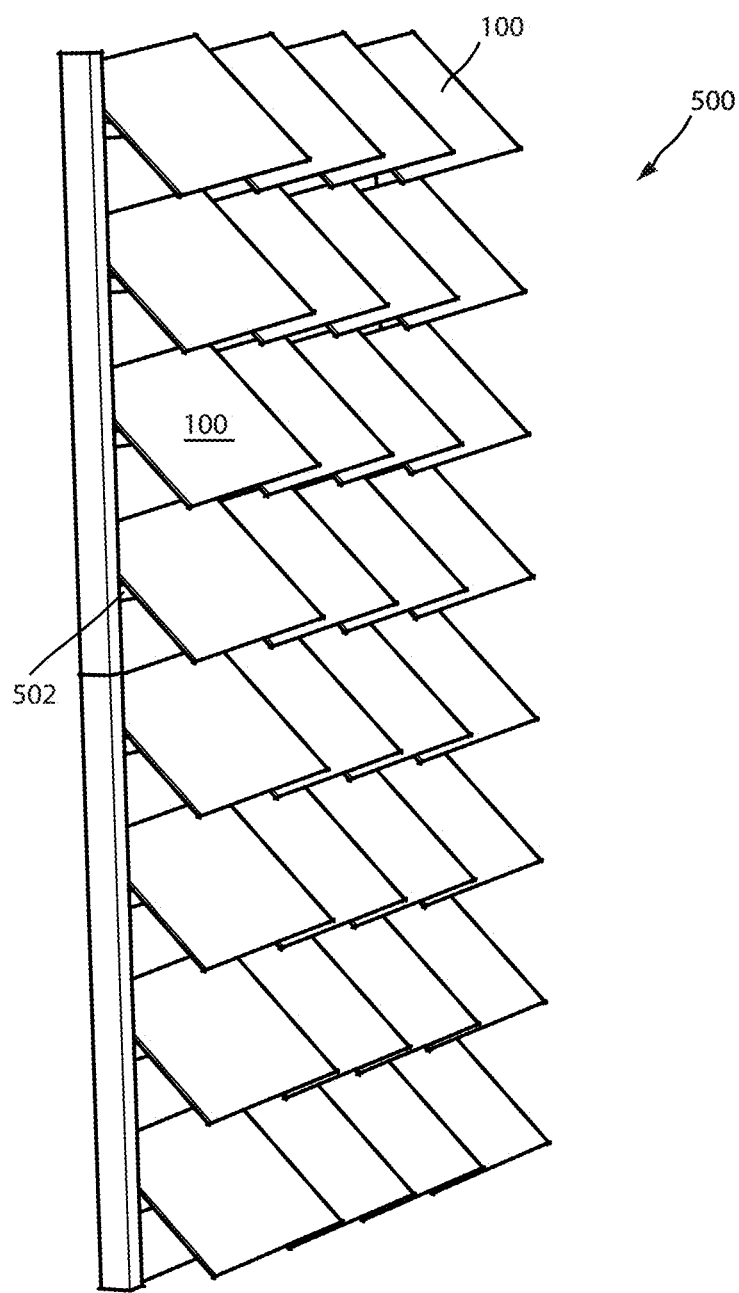
FIG. 12 is a top isometric view of a solar concentration and illumination window mount system.

A similar system to that of FIGS. 11A and 11B can be mounted vertically along the side of a building or over a window, for example, allowing diffuse natural light 11' to be transmitted into the building while the panels 100 are concentrating light and generating electricity, to provide natural illumination. In a second mode of operation, the system can also provide artificial illumination to the inside or outside of the building by means of light sources 14 (comprised within solar illumination and concentration devices 10 or 10'). A vertical solar concentration and illumination system 500 for being mounted over a window or along the side of a building is shown in FIG. 12. The system 500 comprises a dual-axis tilt and roll tracking system 502, similar to that of FIGS. 11A and 11B. for rotating the panels 100 with the first optical components 16 facing the sun for solar concentration, or for rotating them to any other desired position for providing artificial illumination.

Figure 13A:
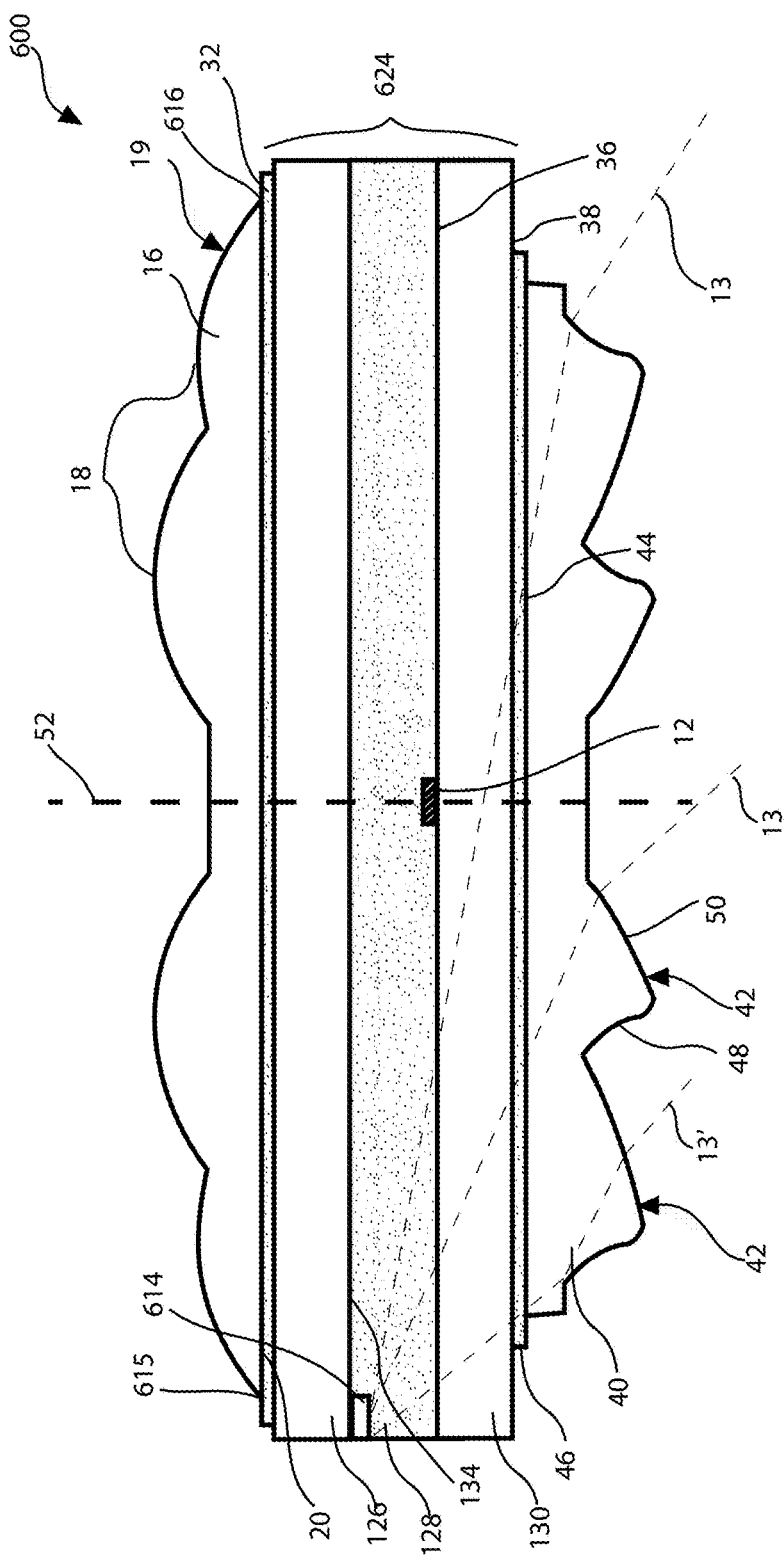
FIG. 13A is a cross-sectional view of a solar concentration and illumination device.

Solar concentration and illumination devices of the present invention can be modified to fulfil any specific illumination application. For example, a solar concentration and illumination device 600 as shown in FIG. 13A is similar to that of FIGS. 1A-1C, and can be fabricated by the same methods. The solar concentration and illumination device 600 comprises a receiving layer 624 comprising a first transparent sheet 126, an encapsulating layer 128, a second transparent sheet 130, electrical conductors (not shown), a solar energy collector 12 and a light source 614. The electrical conductors, the solar energy collector 12, the light source 614, and the encapsulating layer 128 are sandwiched between the first transparent sheet 126 and the second transparent sheet 130. The first transparent sheet 126 and the second transparent sheet 130 are planar, optically transparent sheets of rigid material such as glass or a polymer.

In the embodiment of FIG. 13A, when the solar concentration and illumination device 600 is oriented with the first optical component 16 facing the sun, the plano-convex elements 18 can receive direct input light and focus the light by refraction, such that the focused light travels through the bodies of the first optical component 16, the receiving layer 624, and the second optical component 40 towards an associated first curved surface 48, which, in turn, reflects the light towards the associated second curved surface 50 which is positioned to receive light from its associated first curved surface 48, and reflect the light towards the solar energy collector 12 for converting the light into electrical energy. The path of light being concentrated by the solar concentration and illumination device of FIG. 13A is the same as the path of light described in FIG. 1B in a first mode of operation as a solar concentration device, and just as in FIG. 1B, indirect light can pass through the optical concentration and illumination device 600 of FIG. 13A.

It would be understood, with reference to the embodiments described above, that indirect light can pass through the body of the solar concentration and illumination device 600 and be emitted therefrom; and that light 13 emitted by the light source 614 can be scattered by the optical elements 42 by refraction alone, or by reflection followed by refraction (13, 13') on the first curved surfaces 48 and the second curved surfaces 50, and emitted therefrom in a second mode of operation as an illumination device.

The light source 614 is positioned within the receiving layer aligned with an edge 615 defined by the first optical component 16. In similar embodiments to that of FIG. 13A, a solar concentration and illumination device 601 may comprise a light source 614 aligned with an opposite edge 616 defined by the first optical component 16. In yet another similar embodiment, a solar concentration and illumination device 602 may comprise more than one light source 614 per solar concentration and illumination device 602, and the light sources may be aligned with corners 617 defined by the first optical component 16. In other similar embodiments, the light source 614 can be positioned anywhere between the optical axis 52 and the edges 615, 616 of the first optical component 16.

Figure 13B:
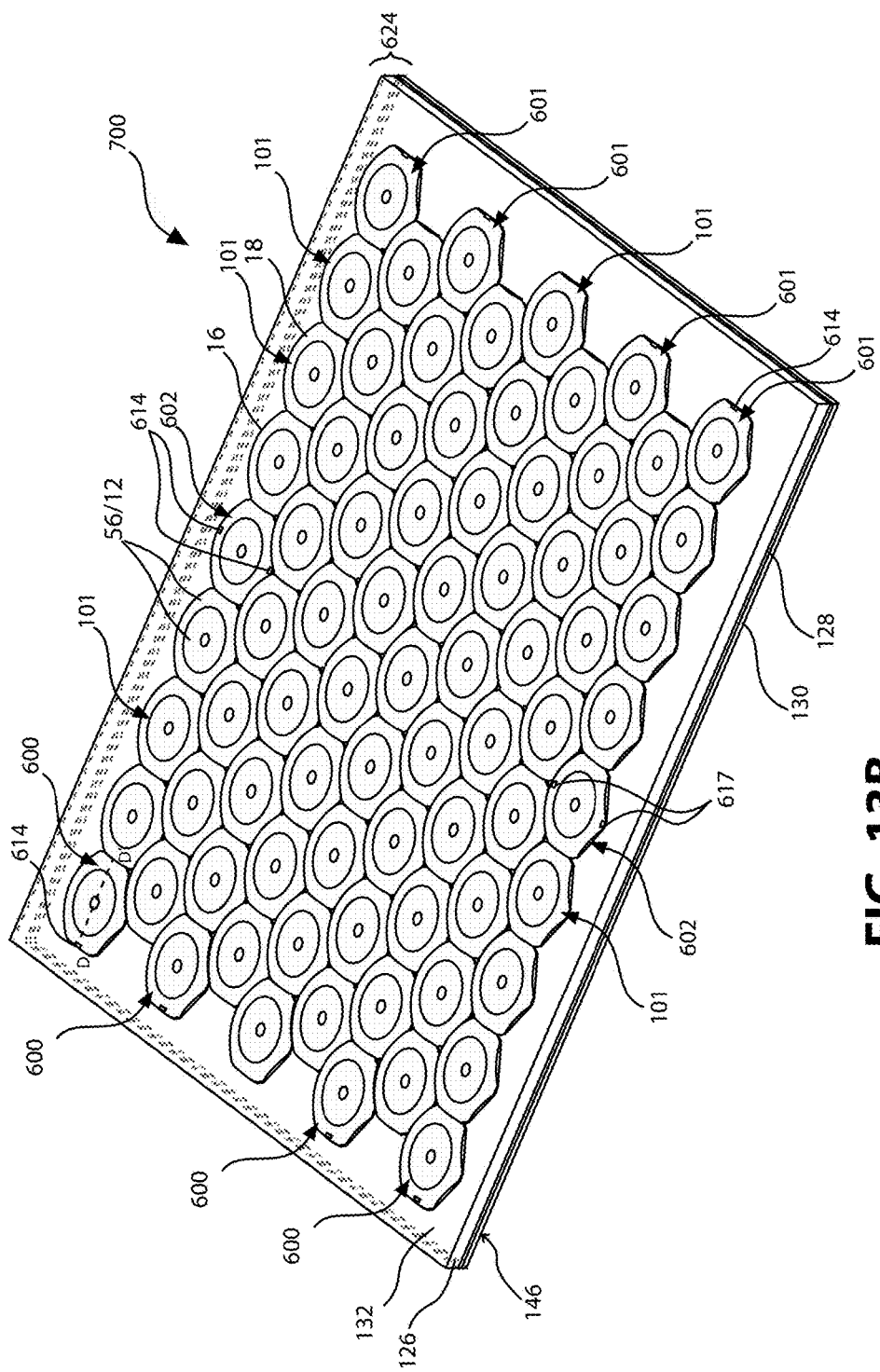
FIG. 13B is a top isometric view of a solar concentration and illumination panel including the solar concentration and illumination device of FIG. 13A.

It is possible to integrate a combination of solar concentration and illumination devices 600, 601 and 602, and solar concentration devices 101 (as shown in FIG. 7) into a solar concentration and illumination panel. One exemplary solar concentration and illumination panel 700 is shown in FIG. 13B, where FIG. 13A is a cross section D-D' of FIG. 13B. In the embodiment of FIG. 13B, an array of solar concentration devices 101 (as described in FIG. 7) and solar concentration and illumination devices 600, 601 and 602 form a solar concentration and illumination panel 700.

The light sources 614 are powered by the electrical conductors, and light 13 emitted by the light sources 614 travels through the bodies of the receiving layer 624 and the first optical components 16, such that light 13 is refracted or scattered by the plano-convex elements 18.

Figure 14A:
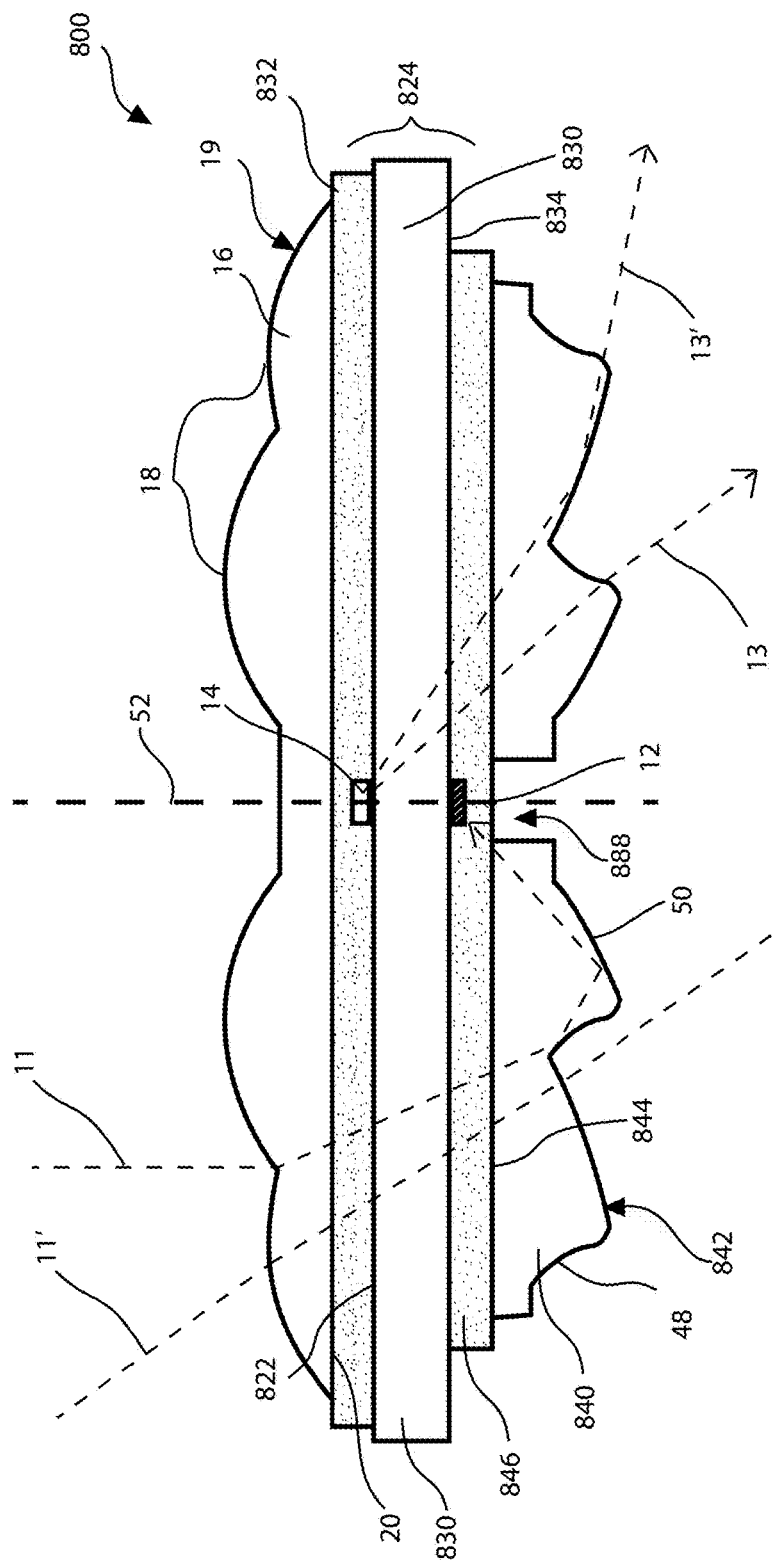
FIG. 14A is a cross-sectional view of a solar concentration and illumination device.

Another embodiment of a solar concentration and illumination device according to the present technology is shown in FIG. 14A, where a solar concentration and illumination device 800 comprises a modified second optical component 840, a single sheet receiving layer 824 and the first optical component 16 (same as described above). FIG. 14A is a cross sectional view of the solar concentrator device 800, for concentrating light 11 over a surface area to the solar energy collector 12 of substantially smaller surface area. Specifically, FIG. 14A shows cross section E-E' of a solar concentration and illumination device 800 comprised within a solar concentration and illumination panel 900 shown in FIG. 14B.

The second optical component 840 is a substantially planar second optical component, having two optical elements 842 for reflecting light 11 and 13', and for refracting and emitting light 13 and 13' to the exterior of the solar concentration and illumination device 800. The second optical component 840 comprises a flat surface 844. Via the flat surface 844, the second optical component 840 can be optically and mechanically bonded to another flat surface (namely, to a second bonding surface 834, described in further detail below). The second optical component 840 defines a hole 888 at its center, such that the material of the second optical component 840 does not directly enter in contact with the solar energy collector 12, avoiding heat damage to the second optical component 840. Furthermore, the second optical component 840 is made of an optically transparent material, which in some embodiments may be an injection molded polymer such as PMMA (Poly(methyl methacrylate)).

The single sheet receiving layer 824 comprises a rigid transparent sheet 830, electrical conductors (not shown), a solar energy collector 12, and at least one light source 14. A portion of the electrical conductors and the at least one light source 14 are attached to a first bonding surface 822 of the rigid transparent sheet 830, and are sandwiched between the first bonding surface 822 of the rigid transparent sheet 830 and the first flat surface 20 of the first optical component 16. The rigid transparent sheet 830 is a planar, optically transparent sheet of rigid material such as glass or a polymer. The electrical conductors and the light source 14 are bonded mechanically to the rigid transparent sheet 830, such that electrical conductors conduct electricity towards the light source 14. Furthermore, the electrical conductors are positioned to substantially avoid the optical path of light being transmitted within the solar concentration and illumination device 800, such as the paths followed by light rays 11, 11'.

A portion of the electrical conductors and the solar energy collector 12 are attached to a second bonding surface 834 of the rigid transparent sheet 830, and are sandwiched between the first bonding surface 834 of the rigid transparent sheet 830 and the flat surface 844 of the second optical component 840. The electrical conductors and the solar energy collector 12 are bonded mechanically to the rigid transparent sheet 830, such that electrical conductors conduct electricity and heat away from the solar energy collector 12. The light rays 11, 11' 13 will generally pass between portions of the electrical conductors, thereby aiding in minimizing optical effects from the electrical circuit, and the rigid transparent sheet 830, being in direct contact with the electrical conductors and the solar energy collectors 12, aids in dissipating heat away from the solar energy collector 12.

An elastomeric first bonding layer 832 is positioned between the flat surface 20 of the first optical component 16 and the first bonding surface 822 of the rigid transparent sheet 830. The first bonding layer 832 may be composed of any suitable optical adhesive, but preferably it is a light-transmissive elastomeric polymer with adhesive properties such as silicone, which can be applied to either the flat surface 20 or to the first bonding surface 822. The two surfaces (20, 822) may then be brought together to form an optical and mechanical bond between the first optical component 16 and the receiving layer 824. The first bonding layer 832 also acts as an encapsulant for the electrical conductors and the light source 14. In some embodiments, a suitable material that can make up the first bonding layer 832 can be applied evenly, in liquid form, to the first bonding surface 822 or to the flat surface 20. This material may then cure or dry to form the first bonding layer 832, such that it creates a solid mechanical bond with each one of the components, holding them together firmly, yet compliantly where the material is elastomeric.

An elastomeric second bonding layer 846 is positioned between the flat surface 844 of the second optical component 840 and the second bonding surface 834 of the rigid transparent sheet 830. The second bonding layer 846 may be composed of any suitable optical adhesive, but preferably it is a light-transmissive elastomeric polymer with adhesive properties such as silicone, which can be applied to either the flat surface 844 or to the second bonding surface 834. The two surfaces (844, 834) may then be brought together to form an optical and mechanical bond between the second optical component 840 and the receiving layer 824. The second bonding layer 846 also acts as an encapsulant for the electrical conductors and the solar energy collector 12. In some embodiments, a suitable material that can make up the second bonding layer 846 can be applied evenly, in liquid form, to the second bonding surface 834 or to the flat surface 844 of the second optical component 840. This material may then cure or dry to form the second bonding layer 846, such that it creates a solid mechanical bond with each one of the components, holding them together firmly, yet compliantly where the material is elastomeric.

The rigid transparent sheet 830 must be thick enough to withstand and dissipate the heat produced by the solar energy collectors 12 and the light sources 14, such that the heat does not damage any of the other components of the solar concentration and illumination device 800, or panel 900. In some embodiments the solar energy collector 12 is a multi-junction photovoltaic cell 34. In some embodiments the light source 14 is a light emitting diode.

Figure 14B:
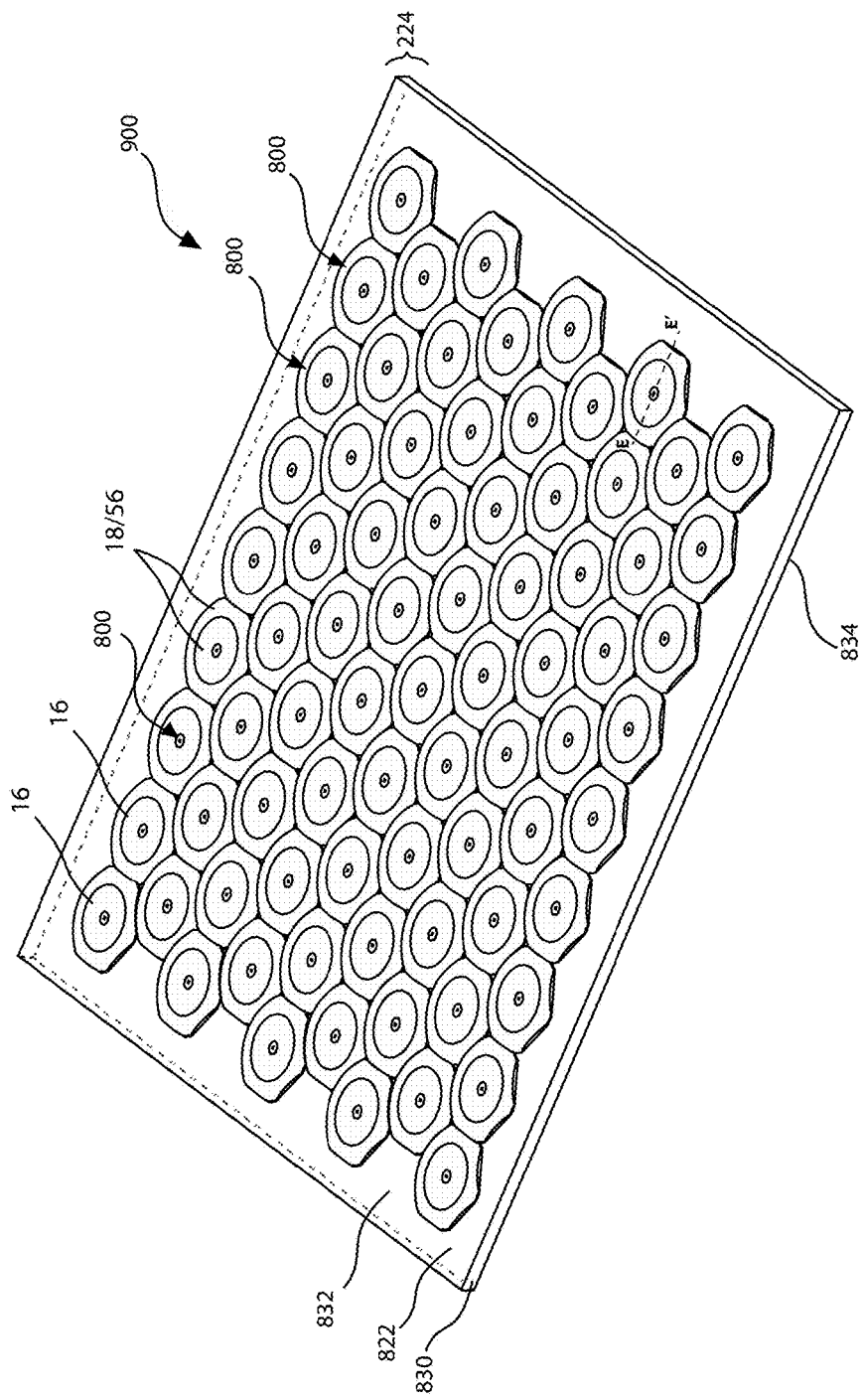
FIG. 14B is a top isometric view of a solar concentration and illumination panel including the solar concentration and illumination device of FIG. 14A.

An array of solar concentration and illumination devices 800 can be combined into a solar concentration and illumination panel 900, similar to previously described embodiments of solar concentration and illumination panels. A solar concentration and illumination panel 900 comprising a single sheet receiving layer 824, an array of first optical components 16, an array of second optical components 840 (not shown), an array of light sources 14 and an array of solar energy collectors 12 is shown in FIG. 14B. Each of the first optical components 16 of the array are optically and mechanically bonded to a first bonding surface 822 of the rigid transparent sheet 830, where the center of the first optical component 16 is aligned with a light source 14 of the array, at the optical axis 52, and where the light source 14 is sandwiched between the first optical component 16 and the rigid transparent sheet 830.

Each of the second optical components 840 of the array are optically and mechanically bonded to a second bonding surface 834 of the rigid transparent sheet 830, where the center of the second optical component 840 is aligned with a solar energy collector 12 of the array, at the optical axis 52, and where the solar energy collector is sandwiched between the first optical component 16 and the rigid transparent sheet 830.

Figure 15:
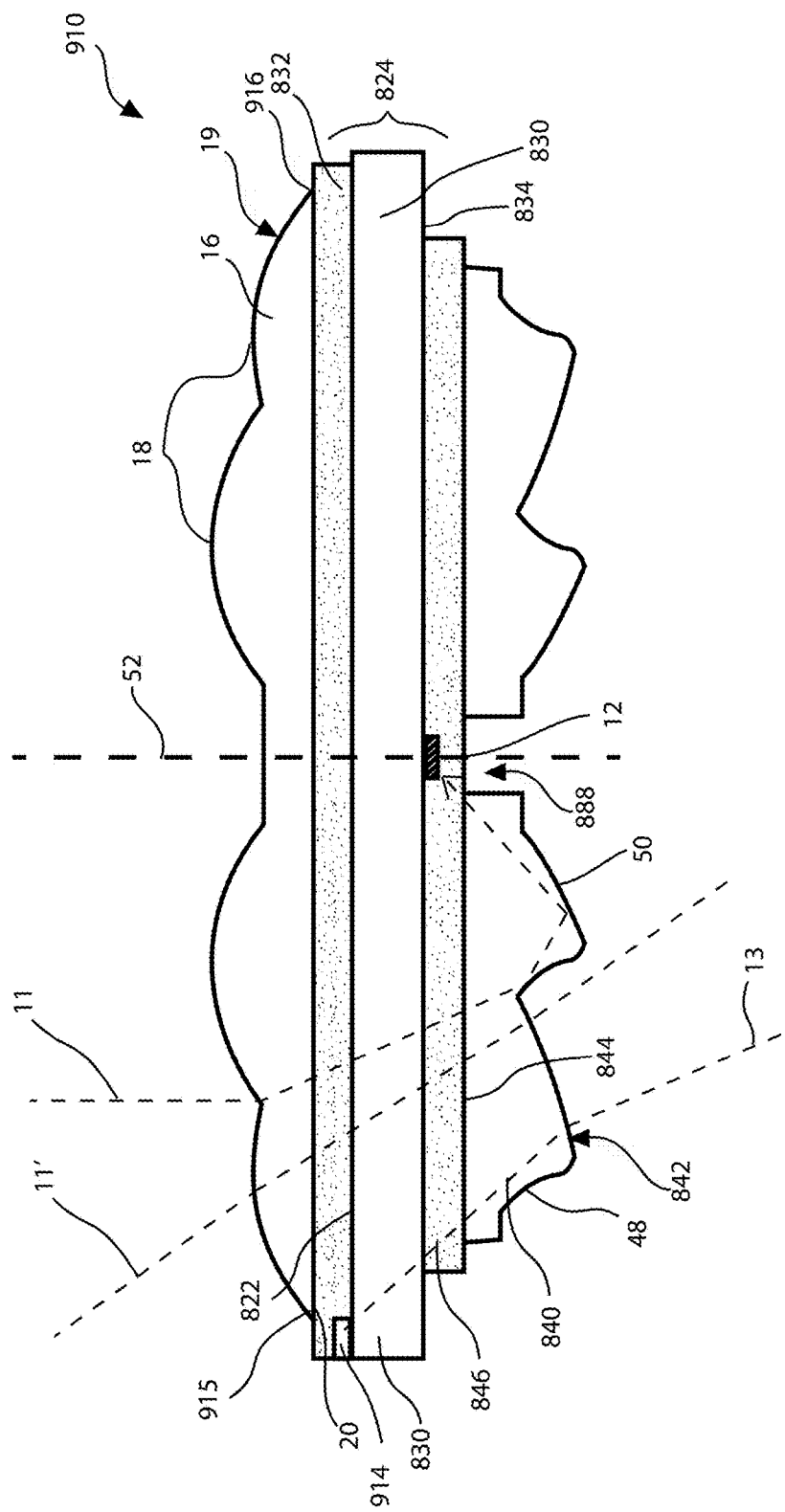
FIG. 15 is a cross-sectional view of a solar concentration and illumination device.

A solar concentration and illumination device 910 as shown in FIG. 15, similar to that of FIGS. 14A-14B, can be fabricated by the same methods as any of the previously described embodiments. The solar concentration and illumination device 910 comprises a modified second optical component 840, a single sheet receiving layer 824 and a first optical component 16.

The second optical component 840 is a substantially planar second optical component, having two optical elements 842 for reflecting light 11 and 13', and for refracting and emitting light 13 and 13' to the exterior of the solar concentration and illumination device 910. The second optical component 840 comprises a flat surface 844. Via the flat surface 844, the second optical component 840 can be optically and mechanically bonded to another flat surface 834. The second optical component 840 defines a hole 888 at its center, such that the material of the second optical component 840 does not directly enter in contact with the solar energy collector 12, avoiding heat damage to the second optical component 840. Furthermore, the second optical component 840 is made of an optically transparent material, which in some embodiments may be an injection molded polymer such as PMMA (Poly(methyl methacrylate)).

The single sheet receiving layer 824 comprises a rigid transparent sheet 830, electrical conductors (not shown), a solar energy collector 12, and at least one light source 914. A portion of the electrical conductors and the at least one light source 914 are attached to a first bonding surface 822 of the rigid transparent sheet 830, and are sandwiched between the first bonding surface 822 of the rigid transparent sheet 830 and the first flat surface 20 of the first optical component 16. The rigid transparent sheet 830 is a planar, optically transparent sheet of rigid material such as glass or a polymer.

The electrical conductors and the light source 914 are bonded mechanically to the rigid transparent sheet 830, such that electrical conductors conduct electricity towards the light source 914. Furthermore, the electrical conductors are positioned to substantially avoid the optical path of light being transmitted within the solar concentration and illumination device 910, such as the paths followed by light rays 11, 11'. The light source 914 is aligned with an edge 615 defined by the first optical component 16.

A portion of the electrical conductors and the solar energy collector 12 are attached to a second bonding surface 834 of the rigid transparent sheet 830, and are sandwiched between the second bonding surface 834 of the rigid transparent sheet 830 and the flat surface 844 of the second optical component 840. The electrical conductors and the solar energy collector 12 are bonded mechanically to the rigid transparent sheet 830, such that electrical conductors conduct electricity and heat away from the solar energy collector 12. The light rays 11, 11' and 13 will generally pass between portions of the electrical conductors, thereby aiding in minimizing optical effects from the electrical circuit, and the rigid transparent sheet 830, being in direct contact with the electrical conductors and the solar energy collectors 12, aids in dissipating heat away from the solar energy collector 12.

An elastomeric first bonding layer 832 is positioned between the flat surface 20 of the first optical component 16 and the first bonding surface 822 of the rigid transparent sheet 830. The first bonding layer 832 may be composed of any suitable optical adhesive, but preferably it is a light-transmissive elastomeric polymer with adhesive properties such as silicone, which can be applied to either the flat surface 20 or to the first bonding surface 822. The two surfaces (20, 822) may then be brought together to form an optical and mechanical bond between the first optical component 16 and the receiving layer 824. The first bonding layer 832 also acts as an encapsulant for the electrical conductors and the light source 914. In some embodiments, a suitable material that can make up the first bonding layer 832 can be applied evenly, in liquid form, to the first bonding surface 822 or to the flat surface 20. This material may then cure or dry to form the first bonding layer 832, such that it creates a solid mechanical bond with each one of the components, holding them together firmly, yet compliantly where the material is elastomeric.

An elastomeric second bonding layer 846 is positioned between the flat surface 844 of the second optical component 840 and the second bonding surface 834 of the rigid transparent sheet 830. The second bonding layer 846 may be composed of any suitable optical adhesive, but preferably it is a light-transmissive elastomeric polymer with adhesive properties such as silicone, which can be applied to either the flat surface 844 or to the second bonding surface 834. The two surfaces (844, 834) may then be brought together to form an optical and mechanical bond between the second optical component 840 and the receiving layer 824. The second bonding layer 846 also acts as an encapsulant for the electrical conductors and the solar energy collector 12. In some embodiments, a suitable material that can make up the second bonding layer 846 can be applied evenly, in liquid form, to the second bonding surface 834 or to the flat surface 844 of the second optical component 840. This material may then cure or dry to form the second bonding layer 846, such that it creates a solid mechanical bond with each one of the components, holding them together firmly, yet compliantly where the material is elastomeric.

The rigid transparent sheet 830 must be thick enough to withstand and dissipate the heat produced by the solar energy collectors 12 and the at least one light source 914, such that the heat does not damage any of the other components of the solar concentration and illumination device 910. In some embodiments the solar energy collector 12 is a multi-junction photovoltaic cell 34. In some embodiments the light source 914 is a light emitting diode.

Figure 16:
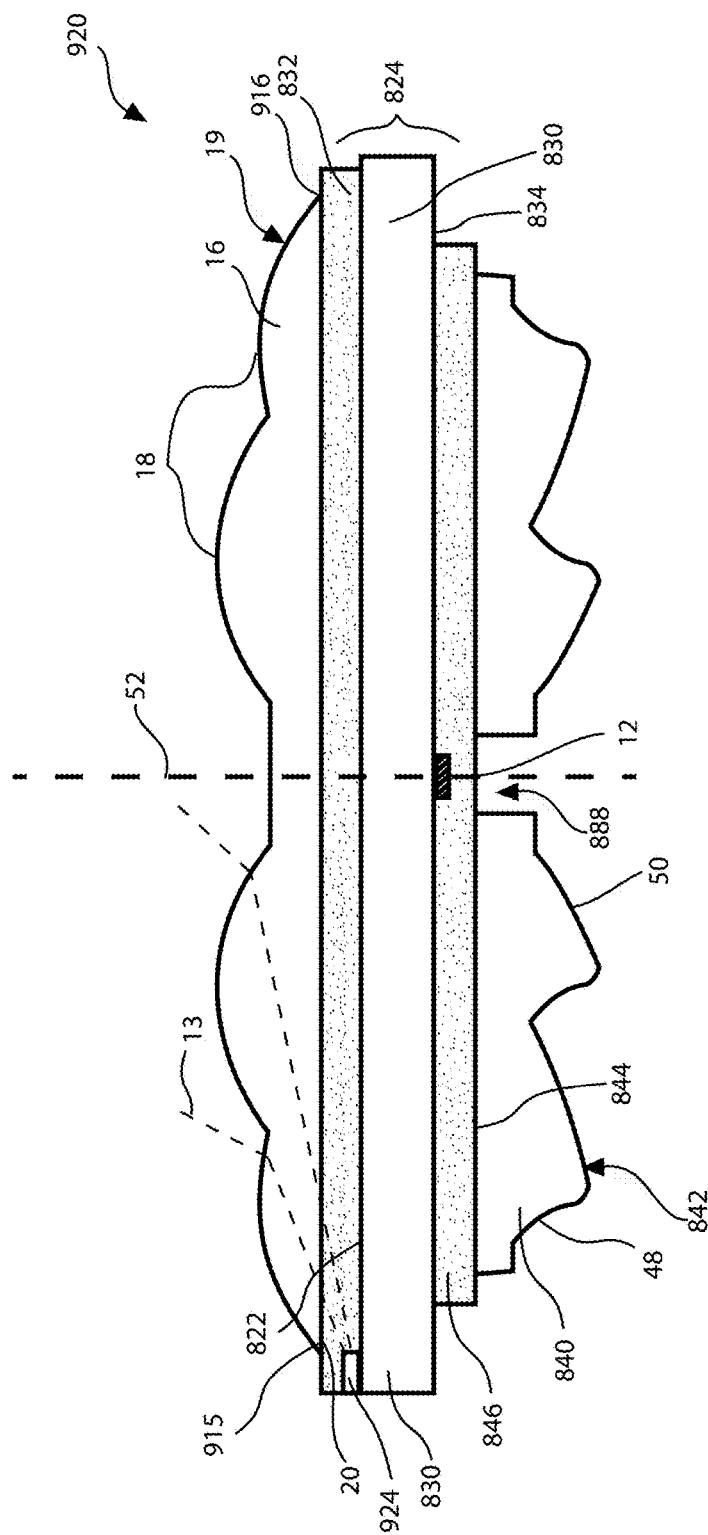
FIG. 16 is a cross-sectional view of a solar concentration and illumination device.

In a similar embodiment, a solar concentration and illumination device may comprise more than one light source per solar concentration and illumination device, and the light sources may be positioned anywhere along the first bonding surface 822 of the rigid transparent sheet 830. In another similar embodiment of a solar concentration and illumination device 920, as shown in FIG. 16, the light sources 924 may emit light 13 towards the first optical component. In other embodiments a solar concentration device may not include a light source 914, 924. Any one of the above described embodiments of solar concentration and illumination devices 910, 920 and variations, including solar concentration devices (without a light source) can be comprised in an array of solar concentration and illumination devices to form a solar concentration and illumination panel, similar to any of the solar concentration and illumination panels previously described.

Figure 17:
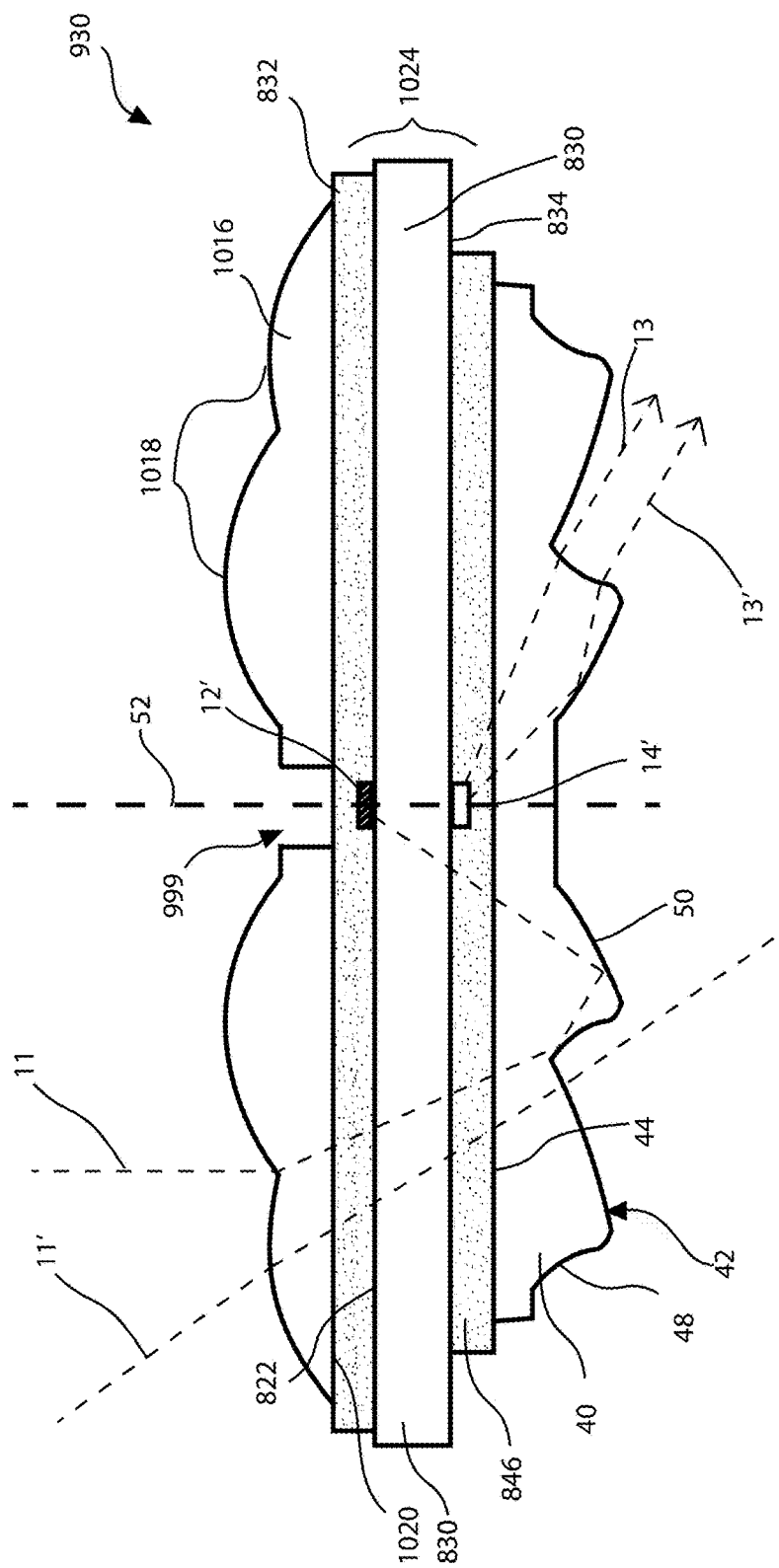
FIG. 17 is a cross-sectional view of a solar concentration and illumination device.

Another embodiment of a solar concentration and illumination device 930, comprising a modified first optical component 1016 and a single sheet receiving layer 1024 is shown in FIG. 17.

In this embodiment the first optical component 1016 is a modified, substantially planar first optical component 1016, having two plano-convex refracting elements 1018 for refracting light 11 (and 13 in embodiments where the light source 14' is facing the first optical component 1016). The first optical component 1016 comprises a flat surface 1020. Via the flat surface 1020, the first optical component 1016 can be optically and mechanically bonded to another flat surface (namely, to a first bonding surface 822). The first optical component 1016 defines a hole 999 at its center, such that the material of the first optical component 1016 does not directly enter in contact with the solar energy collector 12', avoiding heat damage to the first optical component 1016. Furthermore, the first optical component 1016 is made of an optically transparent material, which in some embodiments may be an injection molded polymer such as PMMA (Poly (methyl methacrylate)).

The single sheet receiving layer 824 comprises a rigid transparent sheet 830, electrical conductors (not shown), a solar energy collector 12' and at least one light source 14'. A portion of the electrical conductors and the solar energy collector 12' are attached to the first bonding surface 822 of the rigid transparent sheet 830, and are sandwiched between the first bonding surface 822 of the rigid transparent sheet 830 and the first flat surface 1020 of the first optical component 1016. The rigid transparent sheet 830 is a planar, optically transparent sheet of rigid material such as glass or a polymer. The electrical conductors and the solar energy collector 12' are bonded mechanically to the rigid transparent sheet 830, such that electrical conductors conduct electricity towards and heat away from the solar energy collector 12'. Furthermore, the electrical conductors are positioned to substantially avoid the optical path of light being transmitted within the solar concentration and illumination device 930, such as the paths followed by light rays 11, 11'.

A portion of the electrical conductors and the at least one light source 14' are attached to a second bonding surface 834 of the rigid transparent sheet 830, and are sandwiched between the first bonding surface 834 of the rigid transparent sheet 830 and the flat surface 44 of the second optical component 40. The electrical conductors and the at least one light source 14' are bonded mechanically to the rigid transparent sheet 830, such that electrical conductors conduct electricity to the light source 14'. The light rays 11, 11' and 13 will generally pass between portions of the electrical conductors, thereby minimizing optical effects from the electrical circuit.

An elastomeric first bonding layer 832 is positioned between the flat surface 1020 of the first optical component 1016 and the first bonding surface 822 of the rigid transparent sheet 830. The first bonding layer 832 may be composed of any suitable optical adhesive, but preferably it is a light-transmissive elastomeric polymer with adhesive properties such as silicone, which can be applied to either the flat surface 1020 or to the first bonding surface 822. The two surfaces (1020, 822) may then be brought together to form an optical and mechanical bond between the first optical component 1016 and the receiving layer 824. The first bonding layer 832 also acts as an encapsulant for the electrical conductors and the solar energy collector 12'. In some embodiments, a suitable material that can make up the first bonding layer 832 can be applied evenly, in liquid form, to the first bonding surface 822 or to the flat surface 1020. This material may then cure or dry to form the first bonding layer 832, such that it creates a solid mechanical bond with each one of the components, holding them together firmly, yet compliantly where the material is elastomeric.

An elastomeric second bonding layer 846 is positioned between the flat surface 44 of the second optical component 40 and the second bonding surface 834 of the rigid transparent sheet 830. The second bonding layer 846 may be composed of any suitable optical adhesive, but preferably it is a light-transmissive elastomeric polymer with adhesive properties such as silicone, which can be applied to either the flat surface 44 or to the second bonding surface 834. The two surfaces (44, 834) may then be brought together to form an optical and mechanical bond between the second optical component 40 and the receiving layer 824. The second bonding layer 846 also acts as an encapsulant for the electrical conductors and the light source 14'. In some embodiments, a suitable material that can make up the second bonding layer 846 can be applied evenly, in liquid form, to the second bonding surface 834 or to the flat surface 44 of the second optical component 40. This material may then cure or dry to form the second bonding layer 846, such that it creates a solid mechanical bond with each one of the components, holding them together firmly, yet compliantly where the material is elastomeric.

The rigid transparent sheet 830 must be thick enough to withstand and dissipate the heat produced by the solar energy collectors 12' and the light sources 14', such that the heat does not damage any of the other components of the solar concentration and illumination device 924. In some embodiments the solar energy collector 12' is a multi-junction photovoltaic cell. In some embodiments the light source 14' is a light emitting diode.

In a similar embodiment, a solar concentration and illumination device may comprise more than one light source per solar concentration and illumination device, and the light sources may be positioned anywhere along the second bonding surface 834 of the rigid transparent sheet 830. In another similar embodiment of a solar concentration and illumination device the light source 14' may emit light 13 towards the first optical component. In other embodiments a solar concentration device may not include a light source. Any one of the above described embodiments of solar concentration and illumination devices and its variations, including solar concentration devices (without a light source) can be comprised in an array of solar concentration and illumination devices to form a solar concentration and illumination panel, similar to any of the solar concentration and illumination panels previously described.

Figure 18:
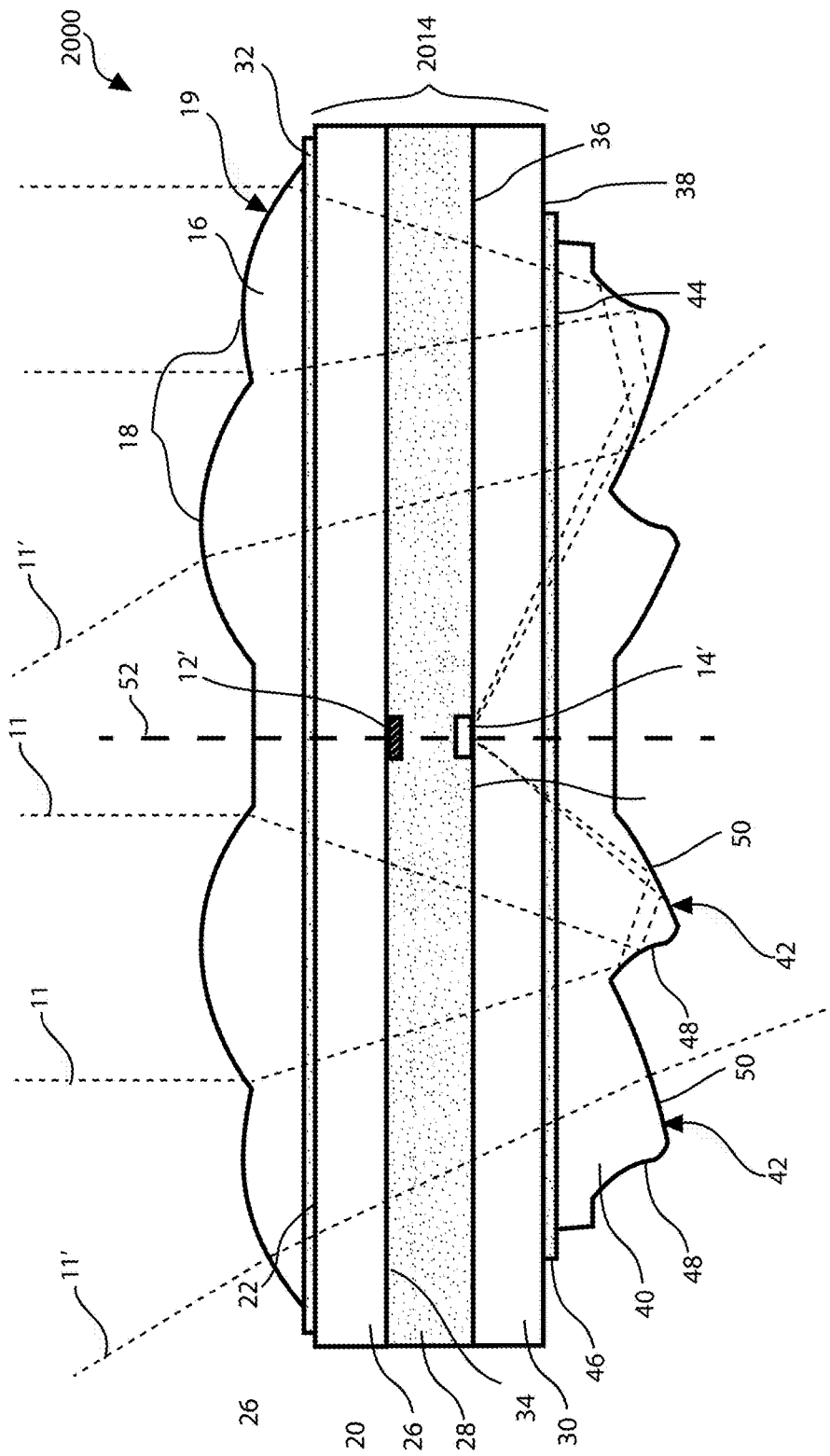
FIG. 18 is a cross-sectional view of a solar concentration and illumination device.

FIG. 18 shows a cross section of a solar concentration and illumination device 940 comprising a double sheet receiving layer 2014.

The solar concentration and illumination device 2000 comprises a substantially planar first optical component 16, as described in previous embodiments. Via the flat surface 20, the first optical component 16 can be optically and mechanically bonded to the first bonding surface 22 of the first transparent sheet 26. Furthermore, the first optical component 16 is made of a solid optically transparent material, which in some embodiments may be an injection molded polymer such as PMMA (Poly(methyl methacrylate)).

The receiving layer 2024 comprises a first transparent sheet 26, an encapsulating layer 28, a second transparent sheet 30, electrical conductors (not shown), a solar energy collector 12' and at least one light source 14'. The electrical conductors, the solar energy collector 12', the at least one light source 14', and the encapsulating layer 28 are sandwiched between the first transparent sheet 26 and the second transparent sheet 30. The first transparent sheet 26 and the second transparent sheet 30 are planar, optically transparent sheets of rigid material such as glass or a polymer.

The first transparent sheet 26 and the second transparent sheet 30 provide rigidity to the solar concentration and illuminations apparatus 2000. The first transparent sheet 26 supports a portion of the electrical conductors and the solar energy collector 12', and aids in dissipating heat away from the solar energy collector 12. The second transparent sheet 30 supports another portion of the electrical conductors and light source 14'. The thickness and material of the first transparent sheet 26 and the second transparent sheet 30 must therefore be chosen taking into account the amount of heat that the light source 14' and the solar energy collector 12' can produce, respectively, such that they can withstand the heat and cool the device 2000 by conduction, without damaging any of the components.

At least a portion of the electrical conductors and the solar energy collector 12' are bonded mechanically to a second bonding surface 34 of the first transparent sheet 26, such that the electrical conductors conduct electricity away from the solar energy collector 12'. The electrical conductors are positioned to substantially avoid the optical path of light 11, 11', 13 being transmitted within the solar concentration and illumination device 2000.

The first transparent sheet 26 is adjacent to the first optical component 16 and is optically and mechanically connected thereto from the first bonding surface 22 of the first transparent sheet 26 by means of an elastomeric first bonding layer 32.

The second transparent sheet 30 comprises a third bonding surface 36 and a fourth bonding surface 38, both bonding surfaces (36, 38) being flat and parallel to one another. At least a portion of the electrical conductors and the at least one light source 14' are bonded mechanically to the third bonding surface 36.

An encapsulating layer 28 occupies the space between the second bonding surface 34 of the first transparent sheet 26 and the third bonding surface 36 of the second transparent sheet 30. The encapsulating layer 28 protects the solar energy collector 12', the light source 14' and the electrical conductors, while creating an optical and mechanical bond between the first transparent sheet 26 and the second transparent sheet 30.

The solar concentration and illumination device 10 further comprises a substantially planar second optical component 40, bonded optically and mechanically to the fourth bonding surface 36 of the second transparent sheet 30 by means of an elastomeric second bonding layer 46. Light may travel through and within the body of the solar concentration and illumination device 2000 as described in any of the above embodiments.

The solar concentration and illumination device 2000 and variations thereof can be comprised in an array of solar concentration and illumination devices to form a solar concentration and illumination panel, similar to any of the solar concentration and illumination panels previously described.

Non-limiting examples of light transmissive materials that may be used to form the first optical components 16, the first transparent sheet 26, 126, the second transparent sheet 30, 130, and the second optical components 40 include glass, light transmissive polymeric materials such as rigid, injection molded poly(methyl methacrylate) (PMMA), polymethyl methacrylimide (PMMI), polycarbonates, cyclo olefin polymers (COP), cyclo olefin copolymers (COC), polytetrafluoroethylene (PTFE), or a combination of these materials. For example, the first transparent sheet 26, 126 and the second transparent sheet 30, 130 can be sheets of glass, and the first optical components and the second optical components 40 can be made of PMMA. Alternatively, the first optical components 16 and the second optical components 40 can be made of a silicone rubber. Attachment of each of the first optical components 16 and the second optical components 30 to the receiving layer 24, 124 can be achieved by optically bonding the first optical components 16 and the second optical components 40 to the receiving layer 24, 124 with an optical bonding agent, laser welding (where all components are made of polymers) or any other means known in the art. As an example, if the first optical components 16 and the second optical components 40 are made of a polymeric material, they can be optically bonded to glass surfaces of the first transparent sheet 26, 126 and second transparent sheet 30, 130 using an optical adhesive such as a silicone. Alternatively, the first optical components 16 and the second optical components 40 can be 3D printed directly onto the glass surfaces of the first transparent sheet 26, 126 and second transparent sheet 30, 130, or the surfaces of the receiving layer 24, 124 can be coated with a polymer, such as a silicone rubber, and the polymeric the first optical components 16 and the second optical components 40 can be 3D printed thereon.

Although the embodiments of the present technology show the first optical components 16 cropped into the shape of a hexagon to eliminate dead space, in other embodiments the first optical components 16 can be circular or cropped into any tileable shape such as a square. Although the illustrated embodiments shows circular second optical components 40, in other embodiments the second optical components can be cropped into any tileable shape such as a hexagon or a square.

Although embodiments have been described above with reference to the accompanying drawings, those of skill in the art will appreciate that variations and modifications may be made without departing from the scope thereof as defined by the appended claims.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A solar concentration and illumination apparatus comprising:
   a receiving layer comprising at least one solar energy collector and at least one light source;
   at least one first transparent optical component disposed on a first side of the receiving layer, the at least one first transparent optical component comprising at least one plano-convex refracting element;
   at least one second transparent optical component disposed on a second side of the receiving layer, the at least one second transparent optical component comprising at least one optical element;
   wherein:
      the at least one plano-convex element is positioned to receive light travelling parallel to an optical axis and refract it towards the at least one optical element of the at least one second transparent optical component,
      the at least one optical element of the at least one second transparent optical component is positioned to reflect light towards the at least one solar energy collector; and
      the at least one optical element of the at least one second transparent optical component is positioned to refract and emit diffuse light impinging thereon towards the exterior of the solar concentrator and illumination apparatus.

2. The solar concentration and illumination apparatus of claim 1 wherein the receiving layer comprises a rigid transparent sheet where the at least one light source is attached to a first side of the rigid transparent sheet, and wherein the at least one solar energy collector is attached to a second side of the rigid transparent sheet.

3. The solar concentration and illumination apparatus of claim 1, wherein:
the receiving layer comprises a first transparent sheet and a second transparent sheet parallel to the first transparent sheet; and
the at least one solar energy collector and the at least one light source are disposed between the first transparent sheet and the second transparent sheet.

4. The solar concentration and illumination apparatus of claim 3, wherein:
the at least one light source is attached to the first transparent sheet, and the at least one solar energy collector is attached to the second transparent sheet.

5. The solar concentration and illumination apparatus of claim 3, wherein:
the first transparent sheet comprises a first planar surface and a second planar surface, and the second transparent sheet comprises a third planar surface and a fourth planar surface;
the light source is attached to one of the second planar surface and the third planar surface, and the solar energy collector is attached to the other of the second planar surface and the third planar surface; and
the first transparent optical component is attached to the first planar surface, and the second transparent optical component is attached to the fourth planar surface.

6. The solar concentration and illumination apparatus of claim 5, wherein the solar energy collector is attached to the second planar surface, and the light source is attached to the third planar surface.

7. The solar concentration and illumination apparatus of claim 1, wherein:
the at least one plano-convex element is positioned to receive direct light and refract it towards the at least one optical element of the at least one second transparent optical component;
the at least one optical element of the at least one second transparent optical component is positioned to reflect light towards the at least one solar energy collector; and
the at least one optical element of the at least one second transparent optical component is positioned to receive light from the at least one light source, and to refract and emit light to the exterior of the solar concentration and illumination apparatus.

8. The solar concentration and illumination apparatus of claim 1, wherein:
the at least one optical element of the second transparent optical component comprises a first curved surface and a second curved surface; and
the first curved surface is positioned to receive light from the plano-convex element and reflect the light towards the second curved surface which in turn is positioned to receive light from the first curved surface and reflect the light towards the at least one solar energy collector.

9. The solar concentration and illumination apparatus of claim 8, wherein the first curved surface and the second curved surface are positioned to reflect light by total internal reflection.

10. The solar illumination and concentration apparatus of claim 8, wherein the first curved surface is positioned to reflect light to the second curved surface by a single reflection.

11. The solar concentration and illumination apparatus of claim 8, wherein the second curved surface is positioned to reflect light to the solar energy collector by a single reflection.

12. The solar concentration and illumination apparatus of claim 1, wherein each of the at least one first transparent optical components and each of the at least one second transparent optical components include at least one planar surface.

13. The solar concentration and illumination apparatus of claim 1, wherein:
the at least one first transparent optical component is an array of first transparent optical components;
the at least one second transparent optical component is an array of second transparent optical components;
the at least one light source is an array of light sources; and
the at least one solar energy collector is an array of solar energy collectors.

14. The solar concentration and illumination apparatus of claim 13, wherein each first transparent optical component is aligned with one of the second transparent optical components and with one of the solar energy collectors along the optical axis.

15. The solar concentration and illumination apparatus of claim 13, wherein
each of the light sources is aligned with:
one of the first transparent optical components,
one of the second transparent optical components, and
one of the solar energy collectors along the optical axis.

16. The solar concentration and illumination apparatus of claim 13, wherein:
the receiving layer comprises a rigid transparent sheet;
the array of light sources is attached to a first side of the rigid transparent sheet; and
the array of solar energy collectors is attached to a second side of the rigid transparent sheet.

17. The solar concentration and illumination apparatus of claim 13, wherein:
the receiving layer comprises a first transparent sheet and a second transparent sheet parallel to the first transparent sheet; and
the array of solar energy collectors and the array of light sources are disposed between the first transparent sheet and the second transparent sheet.

18. The solar concentration and illumination apparatus of claim 17, wherein:
the array of light sources is attached to the first transparent sheet, and the array of solar energy collectors is attached to the second transparent sheet.

19. The solar concentration and illumination apparatus of claim 1, wherein:
the at least one plano-convex element is positioned to:
receive light travelling parallel to the optical axis, and refract it towards the at least one optical element of the at least one second transparent optical component;
the at least one optical element is positioned to reflect light towards the at least one solar energy collector; and
the at least one plano-convex element of the first transparent component is positioned to:
receive light from the at least one light source, and refract and emit light to the exterior of the solar concentration and illumination apparatus.

20. The solar concentration and illumination apparatus of claim 1, wherein the at least one solar energy collector is a photovoltaic cell.

21. The solar concentration and illumination apparatus of claim 1, further comprising an elastomeric layer between the at least one first optical component and the receiving layer.

22. The solar concentration and illumination device of claim 1, further comprising an elastomeric layer between the at least one second optical component and the receiving layer.

23. A solar concentration and illumination system comprising at least one solar concentration and illumination apparatus of claim 1 mounted on a dual-axis tracking system.

* * * * *